United States Patent
Lieber et al.

(10) Patent No.: US 10,435,817 B2
(45) Date of Patent: Oct. 8, 2019

(54) CONTROLLED GROWTH OF NANOSCALE WIRES

(71) Applicant: President and Fellows of Harvard College, Cambridge, MA (US)

(72) Inventors: Charles M. Lieber, Lexington, MA (US); Robert Day, Somerville, MA (US); Max Nathan Mankin, Cambridge, MA (US); Ruixuan Gao, Cambridge, MA (US); Thomas J. Kempa, Somerville, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 15/308,951

(22) PCT Filed: May 6, 2015

(86) PCT No.: PCT/US2015/029373
§ 371 (c)(1),
(2) Date: Nov. 4, 2016

(87) PCT Pub. No.: WO2015/171699
PCT Pub. Date: Nov. 12, 2015

(65) Prior Publication Data
US 2017/0073841 A1    Mar. 16, 2017

Related U.S. Application Data
(60) Provisional application No. 61/989,904, filed on May 7, 2014.

(51) Int. Cl.
*C30B 29/66*     (2006.01)
*B82Y 30/00*     (2011.01)
(Continued)

(52) U.S. Cl.
CPC .............. *C30B 29/66* (2013.01); *B82Y 30/00* (2013.01); *C23C 14/22* (2013.01); *C23C 16/44* (2013.01);
(Continued)

(58) Field of Classification Search
USPC ........ 977/762, 765; 428/357, 364, 369, 370, 428/373, 374, 397, 399, 401
See application file for complete search history.

(56) References Cited

U.S. PATENT DOCUMENTS
10,049,871 B2   8/2018   Lieber et al.
2002/0175408 A1   11/2002   Majumdar et al.
(Continued)

FOREIGN PATENT DOCUMENTS
WO    WO 02/017362 A2    2/2002
WO    WO 02/048701 A2    6/2002
(Continued)

OTHER PUBLICATIONS
International Search Report and Written Opinion for Application No. PCT/US2014/014596 dated Nov. 19, 2014.
(Continued)

*Primary Examiner* — Matthew D Matzek
(74) *Attorney, Agent, or Firm* — Wolf, Greenfield & Sacks, P.C.

(57) ABSTRACT

The present invention generally relates to nanoscale wires, and to methods of producing nanoscale wires. In some aspects, the nanoscale wires are nanowires comprising a core which is continuous and a shell which may be continuous or discontinuous, and/or may have regions having different cross-sectional areas. In some embodiments, the shell regions are produced by passing the shell material (or a precursor thereof) over a core nanoscale wire under conditions in which Plateau-Raleigh crystal growth occurs,
(Continued)

which can lead to non-homogenous deposition of the shell material on different regions of the core. The core and the shell each independently may comprise semiconductors, and/or non-semiconductor materials such as semiconductor oxides, metals, polymers, or the like. Other embodiments are generally directed to systems and methods of making or using such nanoscale wires, devices containing such nanoscale wires, or the like.

13 Claims, 18 Drawing Sheets

(51) Int. Cl.
| | |
|---|---|
| H01L 29/06 | (2006.01) |
| C23C 14/22 | (2006.01) |
| C23C 16/44 | (2006.01) |
| C30B 23/02 | (2006.01) |
| C30B 25/18 | (2006.01) |
| C30B 29/06 | (2006.01) |
| C30B 29/08 | (2006.01) |
| H01L 21/02 | (2006.01) |
| H01L 29/16 | (2006.01) |
| H01L 29/20 | (2006.01) |
| H01L 29/22 | (2006.01) |
| H01L 29/423 | (2006.01) |
| H01L 29/786 | (2006.01) |
| C30B 29/38 | (2006.01) |
| C30B 29/60 | (2006.01) |
| B82Y 40/00 | (2011.01) |
| C23C 18/08 | (2006.01) |
| C23C 18/12 | (2006.01) |

(52) U.S. Cl.
CPC .......... *C30B 23/025* (2013.01); *C30B 25/18* (2013.01); *C30B 29/06* (2013.01); *C30B 29/08* (2013.01); *C30B 29/38* (2013.01); *C30B 29/60* (2013.01); *H01L 21/0256* (2013.01); *H01L 21/02532* (2013.01); *H01L 21/02543* (2013.01); *H01L 21/02546* (2013.01); *H01L 21/02557* (2013.01); *H01L 21/02576* (2013.01); *H01L 21/02579* (2013.01); *H01L 21/02603* (2013.01); *H01L 21/02631* (2013.01); *H01L 29/0673* (2013.01); *H01L 29/16* (2013.01); *H01L 29/20* (2013.01); *H01L 29/22* (2013.01); *H01L 29/42392* (2013.01); *H01L 29/78696* (2013.01); *B82Y 40/00* (2013.01); *C23C 18/08* (2013.01); *C23C 18/12* (2013.01)

(56) References Cited

U.S. PATENT DOCUMENTS

| | | |
|---|---|---|
| 2006/0188774 A1 | 8/2006 | Niu et al. |
| 2007/0051942 A1 | 3/2007 | Brown et al. |
| 2007/0086916 A1 | 4/2007 | LeBoeuf et al. |
| 2008/0266556 A1* | 10/2008 | Kamins .................. B82Y 20/00 356/301 |
| 2009/0095950 A1 | 4/2009 | Lieber et al. |
| 2009/0242869 A1 | 10/2009 | Hovel et al. |
| 2009/0289244 A1 | 11/2009 | Pryor et al. |
| 2009/0289245 A1 | 11/2009 | Jin et al. |
| 2010/0075145 A1 | 3/2010 | Joo et al. |
| 2010/0148149 A1* | 6/2010 | Pedersen ................. H01L 33/24 257/13 |
| 2010/0190005 A1 | 7/2010 | Nair et al. |
| 2010/0252813 A1 | 10/2010 | Crowder et al. |
| 2011/0042641 A1* | 2/2011 | Lieber .................... B82Y 30/00 257/9 |
| 2011/0175059 A1 | 7/2011 | Kahen et al. |
| 2012/0006390 A1 | 1/2012 | Huo et al. |
| 2012/0177319 A1 | 7/2012 | Alemohammad et al. |
| 2015/0380244 A1 | 12/2015 | Lieber et al. |
| 2017/0117147 A1 | 4/2017 | Lieber et al. |

FOREIGN PATENT DOCUMENTS

| | | |
|---|---|---|
| WO | WO 02/080280 A1 | 10/2002 |
| WO | WO 04/038767 A2 | 5/2004 |

OTHER PUBLICATIONS

International Preliminary Report on Patentability for Application No. PCT/US2014/014596 dated Aug. 20, 2015.
Invitation to Pay Additional Fees for Application No. PCT/US2015/029373 dated Jul. 21, 2015.
International Search Report and Written Opinion for Application No. PCT/US2015/029373 dated Sep. 30, 2015.
International Preliminary Report on Patentability for Application No. PCT/US2015/029373 dated Nov. 17, 2016.
Invitation to Pay Additional Fees for Application No. PCT/US2015/035317 dated Sep. 2, 2015.
International Search Report and Written Opinion for Application No. PCT/US2015/035317 dated Nov. 24, 2015.
International Preliminary Report on Patentability dated Dec. 22, 3016 for Application No. PCT/US2015/035317.
Kempa et al., Facet-selective growth on nanowires yields multi-component nanostructures and photonic devices. J Am Chem Soc. Dec. 11, 2013;135(49):18354-7. doi: 10.1021/ja411050r. Epub Dec 2, 2013.
U.S. Appl. No. 14/766,285, filed Aug. 6, 2015, Lieber et al.
U.S. Appl. No. 15/317,997, filed Dec. 12, 2016, Lieber et al.
PCT/US2014/014596, dated Nov. 19, 2014, International Search Report and Written Opinion.
PCT/US2014/014596, dated Aug. 20, 2015, International Preliminary Report on Patentability.
PCT/US2015/029373, dated Jul. 21, 2015, Invitation to Pay Additional Fees.
PCT/US2015/029373, dated Sep. 30, 2015, International Search Report and Written Opinion.
PCT/US2015/029373, dated Nov. 17, 2016, International Preliminary Report on Patentability.
PCT/US2015/035317, dated Sep. 2, 2015, Invitation to Pay Additional Fees.
PCT/US2015/035317, dated Nov. 24, 2015, International Search Report and Written Opinion.
PCT/US2015/035317, dated Dec. 22, 2016, International Preliminary Report on Patentability.

* cited by examiner

CONTROLLED GROWTH OF NANOSCALE WIRES

RELATED APPLICATIONS

This application is a national stage filing under 35 U.S.C. § 371 of International Application No. PCT/US2015/029373, filed May 6, 2015, entitled "Controlled Growth of Nanoscale Wires," by Lieber, et al., which claims the benefit of U.S. Provisional Patent Application Ser. No. 61/989,904, filed May 7, 2014, entitled "Controlled Growth of Nanoscale Wires," by Lieber, et al., incorporated herein by reference in its entirety.

GOVERNMENT FUNDING

This invention was made with government support under Grant No. N00244-09-1-0078 awarded by Department of Defense, Office of Naval Research. The government has certain rights in the invention.

FIELD

The present invention generally relates to nanoscale wires, and to methods of producing nanoscale wires.

BACKGROUND

Interest in nanotechnology, in particular sub-microelectronic technologies such as semiconductor quantum dots and nanowires, has been motivated by the challenges of chemistry and physics at the nanoscale, and by the prospect of utilizing these structures in electronic and related devices. Nanoscopic articles might be well-suited for transport of charge carriers and excitons (e.g. electrons, electron pairs, etc.) and thus may be useful as building blocks in nanoscale applications.

SUMMARY

The present invention generally relates to nanoscale wires, and to methods of producing nanoscale wires. The subject matter of the present invention involves, in some cases, interrelated products, alternative solutions to a particular problem, and/or a plurality of different uses of one or more systems and/or articles.

In one aspect, the present invention is generally directed to an article, such as a nanoscale wire. In some cases, the nanoscale wire is a nanowire. For example, in one set of embodiments, the article comprises a nanowire comprising a continuous core comprising a first longitudinal portion comprising a shell at least partially surrounding the core and having a substantially constant cross-sectional area, and a second longitudinal portion having a substantially constant cross-section area smaller than the first longitudinal portion. In some embodiments, the first longitudinal portion has a first dimension orthogonal to the core and a second dimension orthogonal to the first dimension and to the core, where an aspect ratio of the first dimension to the second dimension is at least about 1.5:1. In certain cases, the core and the shell material have different compositions.

In another set of embodiments, the article comprises a nanowire comprising a continuous semiconductor oxide core and a plurality of discontinuous semiconductor shell regions.

The article, in yet another set of embodiments, comprises a nanowire comprising a continuous semiconductor oxide core comprising a first longitudinal portion having a length of at least 5 nm and a first substantially constant cross-sectional area, a second longitudinal portion having a length of at least 5 nm a second substantially constant cross-section area smaller than the first longitudinal portion, and a transitional portion between the first longitudinal portion and the second longitudinal portion, the transitional portion having a length of at least about 10 nm.

According to still another set of embodiments, the article comprises a nanowire comprising a continuous core and a plurality of discontinuous shell regions. In some cases, some or all of the discontinuous shell regions each consist of a single crystal.

In one set of embodiments, the article comprises a nanowire comprising a continuous core and a plurality of discontinuous shell regions. In some cases, the discontinuous shell regions each consist of a single crystal.

The article, in another set of embodiments, includes a nanowire comprising a continuous metallic core and a plurality of discontinuous semiconductor shell regions.

In yet another set of embodiments, the article comprises a nanowire comprising a continuous polymeric core and a plurality of discontinuous semiconductor shell regions.

According to still another set of embodiments, the article comprises a nanowire comprising a continuous core and a plurality of discontinuous shell regions. In some embodiments, the discontinuous shell regions each comprise a plurality of nanoparticles.

The article, in another set of embodiments, includes a nanowire comprising a continuous semiconductor oxide core comprising a first longitudinal portion having a length of at least 5 nm and a substantially constant cross-sectional area, a second longitudinal portion having a length of at least 5 nm and a substantially constant cross-section area smaller than the first longitudinal portion. In some embodiments, the first longitudinal portion has a first dimension orthogonal to the core and a second dimension orthogonal to the first dimension and to the core. In certain cases, an aspect ratio of the first dimension to the second dimension is at least about 1.5:1.

The article, in yet another set of embodiments, comprises a nanowire comprising a continuous metallic core comprising a first longitudinal portion having a length of at least 5 nm and a first substantially constant cross-sectional area, a second longitudinal portion having a length of at least 5 nm a second substantially constant cross-section area smaller than the first longitudinal portion, and a transitional portion between the first longitudinal portion and the second longitudinal portion, the transitional portion having a length of at least about 10 nm.

In still another set of embodiments, the article includes a nanowire comprising a continuous metallic core comprising a first longitudinal portion having a length of at least 5 nm and a substantially constant cross-sectional area, a second longitudinal portion having a length of at least 5 nm and a substantially constant cross-section area smaller than the first longitudinal portion. In some cases, the first longitudinal portion has a first dimension orthogonal to the core and a second dimension orthogonal to the first dimension and to the core, wherein an aspect ratio of the first dimension to the second dimension is at least about 1.5:1.

According to yet another set of embodiments, the article comprises a nanowire comprising a continuous polymeric core comprising a first longitudinal portion having a length of at least 5 nm and a first substantially constant cross-sectional area, a second longitudinal portion having a length of at least 5 nm a second substantially constant cross-section area smaller than the first longitudinal portion, and a transitional longitudinal portion between the first longitudinal portion and the second longitudinal portion, the transitional portion having a length of at least about 10 nm.

In another set of embodiments, the article comprises a nanowire comprising a continuous polymeric core comprising a first longitudinal portion having a length of at least 5 nm and a substantially constant cross-sectional area, a second longitudinal portion having a length of at least 5 nm and a substantially constant cross-section area smaller than the first longitudinal portion. In some cases, the first longitudinal portion has a first dimension orthogonal to the core and a second dimension orthogonal to the first dimension and to the core. In some embodiments, an aspect ratio of the first dimension to the second dimension is at least about 1.5:1.

In accordance with another set of embodiments, the article includes a nanowire comprising a continuous core comprising a first longitudinal portion comprising a shell at least partially surrounding the core having a length of at least 5 nm and a substantially constant cross-sectional area, a second longitudinal portion having a length of at least 5 nm and a substantially constant cross-section area smaller than the first longitudinal portion, and a transitional longitudinal portion between the first longitudinal portion and the second longitudinal portion, where the transitional portion has a length of at least about 10 nm. In some embodiments, the core and the shell material comprise different materials.

The article, in yet another set of embodiments, comprises a nanowire comprising a continuous core comprising a first longitudinal portion having a length of at least 5 nm and a first substantially constant cross-sectional area, a second longitudinal portion having a length of at least 5 nm a second substantially constant cross-section area smaller than the first longitudinal portion, and a transitional longitudinal portion between the first longitudinal portion and the second longitudinal portion, the transitional longitudinal having a length of at least about 10 nm.

According to still another set of embodiments, the article comprises a nanowire comprising a continuous core comprising a first longitudinal portion having a length of at least 5 nm and a substantially constant cross-sectional area, a second longitudinal portion having a length of at least 5 nm and a substantially constant cross-section area smaller than the first longitudinal portion. In some embodiments, the first longitudinal portion has a first dimension orthogonal to the core and a second dimension orthogonal to the first dimension and to the core. In certain cases, an aspect ratio of the first dimension to the second dimension is at least about 1.5:1.

In another set of embodiments, the present invention is generally directed to a nanowire comprising a core and at least one shell, e.g., as discussed herein. The core may comprise a metal, a semiconductor, a semiconductor oxide, a polymer, particles, or the like. The shell may independently be a semiconductor, a metal, a polymer, an oxide, an insulator, a dielectric, and/or the shell may comprise particles. Thus, for example, the core may comprise a metal and the shell may comprise a semiconductor, or the core may comprise a metal and the shell may comprise a metal, or the core may comprise a metal and the shell may comprise a polymer, or the core may comprise a metal and the shell may comprise a semiconductor oxide, or the core may comprise a metal and the shell may comprise a semiconductor, or the core may comprise a metal and the shell may comprise an insulator, or the core may comprise a metal and the shell may comprise a dielectric, or the core may comprise a metal and the shell may comprise particles, or the core may comprise a semiconductor and the shell may comprise a semiconductor, or the core may comprise a semiconductor and the shell may comprise a metal, or the core may comprise a semiconductor and the shell may comprise a polymer, or the core may comprise a semiconductor and the shell may comprise a semiconductor oxide, or the core may comprise a semiconductor and the shell may comprise a semiconductor, or the core may comprise a semiconductor and the shell may comprise an insulator, or the core may comprise a semiconductor and the shell may comprise a dielectric, or the core may comprise a semiconductor and the shell may comprise particles, or the core may comprise a semiconductor oxide and the shell may comprise a semiconductor, or the core may comprise a semiconductor oxide and the shell may comprise a metal, or the core may comprise a semiconductor oxide and the shell may comprise a polymer, or the core may comprise a semiconductor oxide and the shell may comprise a semiconductor oxide, or the core may comprise a semiconductor oxide and the shell may comprise a semiconductor, or the core may comprise a semiconductor oxide and the shell may comprise an insulator, or the core may comprise a semiconductor oxide and the shell may comprise a dielectric, or the core may comprise a semiconductor oxide and the shell may comprise particles, or the core may comprise a polymer and the shell may comprise a semiconductor, or the core may comprise a polymer and the shell may comprise a metal, or the core may comprise a polymer and the shell may comprise a polymer, or the core may comprise a polymer and the shell may comprise a semiconductor oxide, or the core may comprise a polymer and the shell may comprise a semiconductor, or the core may comprise a polymer and the shell may comprise an insulator, or the core may comprise a polymer and the shell may comprise a dielectric, or the core may comprise a polymer and the shell may comprise particles, etc.

In addition, the present invention, in some aspects, is generally directed to systems and methods for making a nanoscale wire. In some cases, the nanoscale wire is a nanowire. In one set of embodiments, for example, the method includes acts of depositing a shell material on a nanowire by flowing a fluid comprising the shell material or a precursor thereof over the nanowire at a flowrate of less than about 10 sccm at a temperature of between about 700° C. and about 900° C. and under a pressure of less than about 1 torr. The fluid may be a liquid or a gas (or the fluid may comprise both a liquid and a gas, in some cases).

According to another set of embodiments, the method includes an act of depositing a shell material on a nanowire by flowing a fluid comprising the shell material or a precursor thereof over the nanowire such that the surface diffusion length of the shell material on the surface of the nanowire is at least about 100 nm.

In still another set of embodiments, the method includes an act of depositing a shell material on a nanowire by flowing a fluid comprising the shell material (or a precursor thereof) over the nanowire at a flowrate of less than about 10 sccm at a temperature of between about 700° C. and about 900° C. and under a pressure of less than about 1 torr. In some cases, the flowrate may be less than about 20 sccm. In some cases, the fluid flows longitudinally over the nanowire.

The method, in yet another set of embodiments, includes an act of depositing a shell material (or a precursor thereof) on a nanowire by flowing a fluid comprising the shell material over the nanowire such that the surface diffusion length of the shell material on the surface of the nanowire is at least about 100 nm. In some cases, the fluid flows longitudinally over the nanowire.

In one set of embodiments, the method includes an act of flowing a fluid, such as a liquid and/or a gas, comprising a shell material (or a precursor thereof) over a nanowire such that the shell material deposits on the nanowire in a plurality of discontinuous shell regions. In some cases, the fluid flows longitudinally over the nanowire.

The method, in accordance with another set of embodiments, includes an act of depositing a shell material (or a precursor thereof) on a nanowire by flowing a fluid, such as a liquid and/or a gas, comprising the shell material over the nanowire under Plateau-Raleigh crystal growth conditions. In some cases, the fluid flows longitudinally over the nanowire.

The method, in still another set of embodiments, includes an act of depositing a shell material (or a precursor thereof) on a nanowire by flowing a fluid, such as a liquid and/or a gas, comprising the shell material over the nanowire such that the shell material is able to minimize its surface area. In some cases, the fluid flows longitudinally over the nanowire.

In yet another set of embodiments, the method includes an act of thermally evaporating a shell material (or a precursor thereof) onto a nanowire such that the shell material deposits on the nanowire in a plurality of discontinuous shell regions. In yet another set of embodiments, the method includes an act of depositing a shell material (or a precursor thereof) onto a nanowire via physical vapor deposition such that the shell material deposits on the nanowire in a plurality of discontinuous shell regions.

According to still another set of embodiments, the method includes an act of depositing a shell material (or a precursor thereof) on a nanowire by flowing a fluid comprising the shell material over the nanowire such that the shell material is able to minimize its surface area. In some cases, the fluid flows longitudinally over the nanowire.

The method, in yet another set of embodiments, comprises an act of depositing a shell material (or a precursor thereof) on a nanowire by flowing a fluid comprising the shell material over the nanowire under Plateau-Raleigh crystal growth conditions. In some cases, the fluid flows longitudinally over the nanowire.

In one set of embodiments, the method includes an act of flowing a fluid comprising a shell material (or a precursor thereof) over a nanowire such that the shell material deposits on the nanowire in a plurality of discontinuous shell regions. In some cases, the fluid flows longitudinally over the nanowire.

In another aspect, the present invention encompasses methods of making one or more of the embodiments described herein, for example, nanoscale wires. In still another aspect, the present invention encompasses methods of using one or more of the embodiments described herein, for example, nanoscale wires.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

The present invention generally relates to nanoscale wires, and to methods of producing nanoscale wires. In some aspects, the nanoscale wires are nanowires comprising a core which is continuous and a shell which may be continuous or discontinuous, and/or may have regions having different cross-sectional areas. In some embodiments, the shell regions are produced by passing the shell material (or a precursor thereof) over a core nanoscale wire under conditions in which Plateau-Raleigh crystal growth occurs, which can lead to non-homogenous deposition of the shell material on different regions of the core. The core and the shell each independently may comprise semiconductors, and/or non-semiconductor materials such as semiconductor oxides, metals, polymers, or the like. Other embodiments are generally directed to systems and methods of making or using such nanoscale wires, devices containing such nanoscale wires, or the like.

Figure 13A:
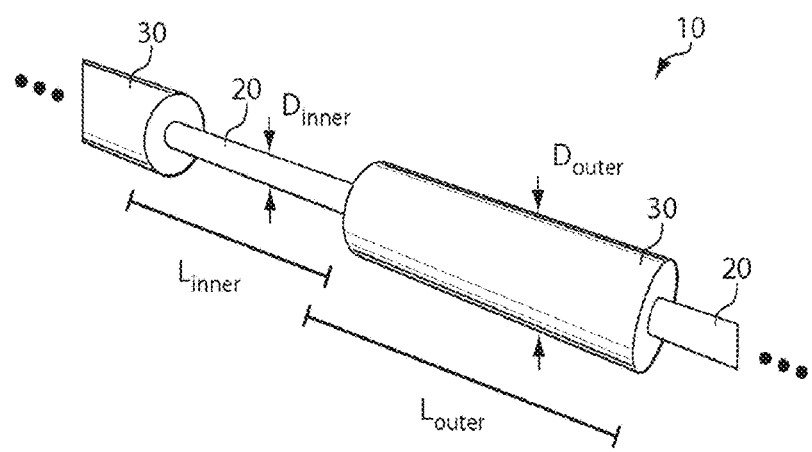
FIGS. 13A-13C are schematic diagrams used for modeling, in certain embodiments of the invention.

Referring now to FIG. 13A, in one aspect, the present invention is generally directed to a nanoscale wire 10 having a core 20 and one or more shell regions 30. The core 20 may be a nanowire, and may comprise a semiconductor material (e.g., germanium, silicon, indium phosphide, etc.), a dielectric material such as a semiconductor oxide (e.g., silicon dioxide), a metal (e.g., Ni, Pt, Au, etc.), a polymer (e.g., polyaniline, polypyrrole, etc.), or the like. Other materials are discussed below. In some embodiments, the core has a substantially uniform cross-sectional area along the length of the core. The core can be prepared using techniques known to those of ordinary skill in the art, such as those discussed below.

There may also be a shell 30 surrounding at least part of the core 20. The shell may be formed from a semiconductor material, or other materials such as dielectric materials, semiconductor oxides, metals, polymers, nanoparticles, or the like. In some cases, the shell material is substantially crystalline, and in some cases, the shell material is substantially monocrystalline. The core may also be composed of crystallites in certain cases. The shell may have the same or a different composition from than the core.

Figure 3A:
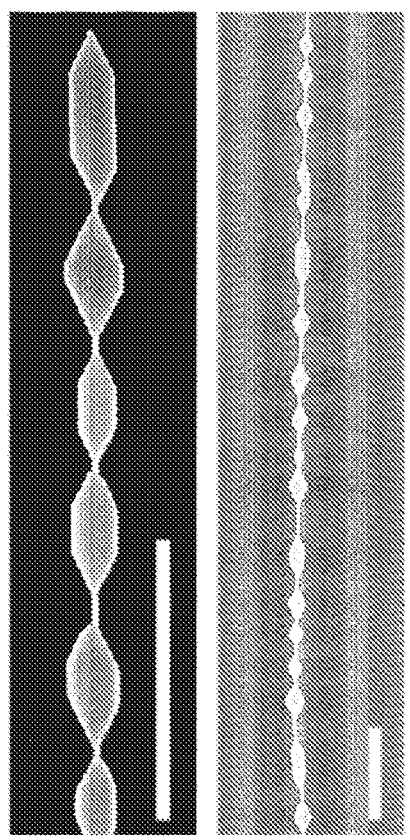
FIGS. 3A-3D illustrate various nanoscale wires, in some embodiments of the invention.
Figure 3B:
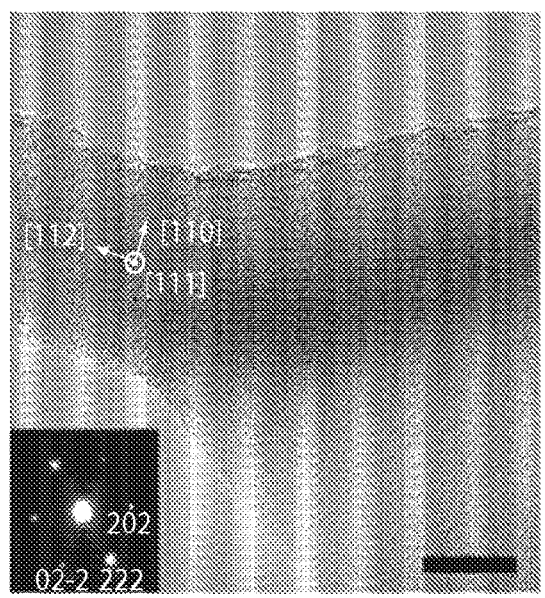
Figure 3C:
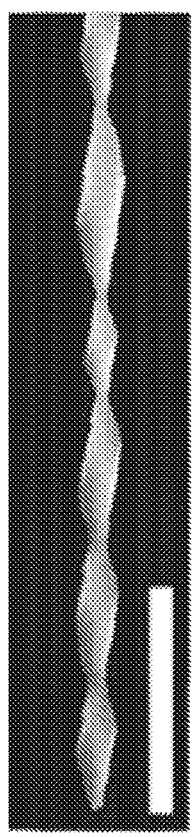
Figure 3D:
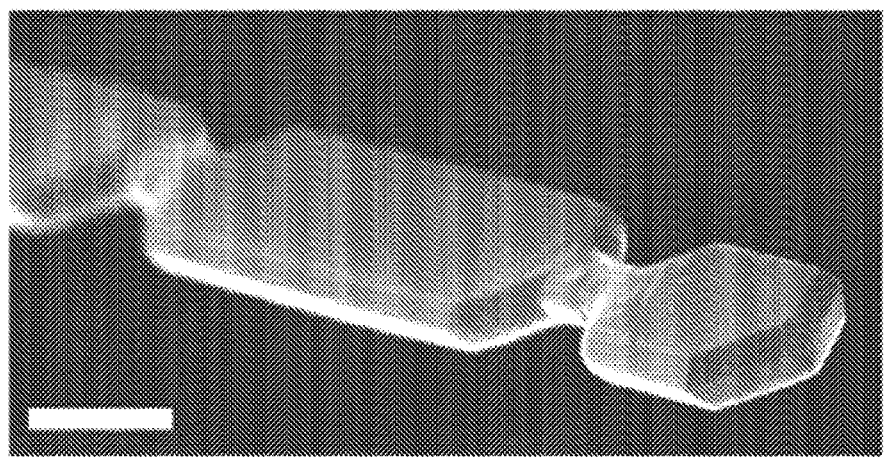

The shell may be present as discontinuous regions along core 20, as shown in FIG. 13A, or as a continuous region, but with portions having different cross-sectional areas. The shell may be cylindrically symmetrical around the core, as is shown in FIG. 13A, although in some cases, the shell may be non-cylindrically symmetrically distributed around the core, for example, as shown in FIG. 3D with the shell having a substantially rectangular cross-sectional area. In certain embodiments, the shell regions may be substantially regularly spaced along the core 20, and the average spacing or periodicity may be referred to as the "pitch" of the shells along the core. Thus, as a non-limiting example, the pitch of the shells along the core may be between about 5 nm and about 100 micrometers. In addition, it should also be understood that in reality, there may also be some deviations from perfect periodicity or perfect pitch.

Figure 7A:
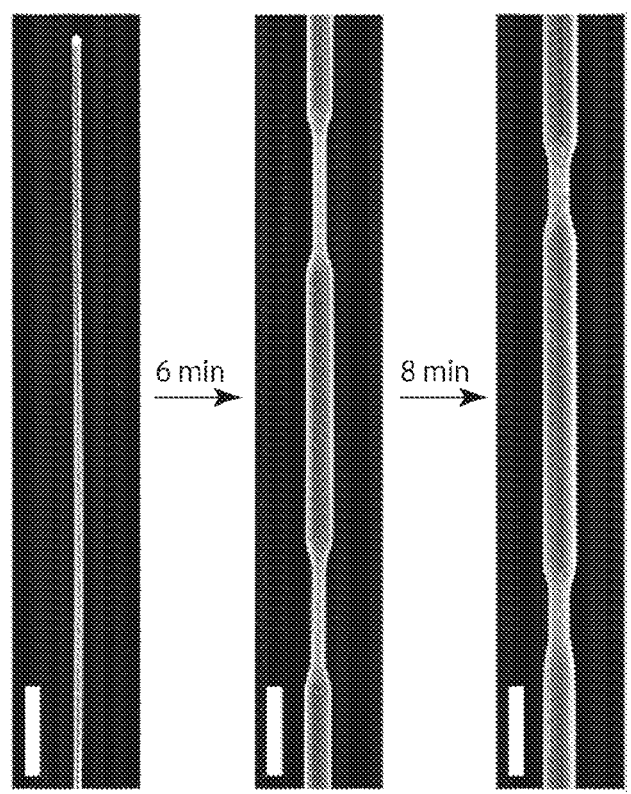
FIGS. 7A-7B illustrates a time sequence of Plateau-Raleigh crystal growth, in some embodiments of the invention.
Figure 7B:
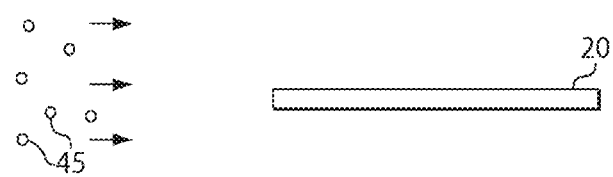
Figure 7B:
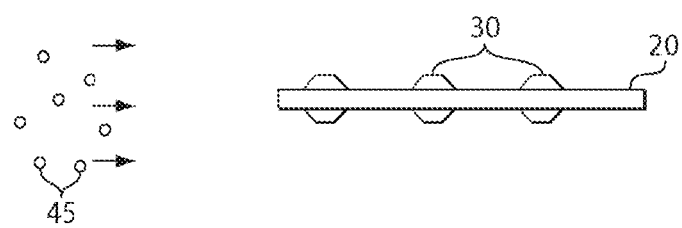
Figure 8A:
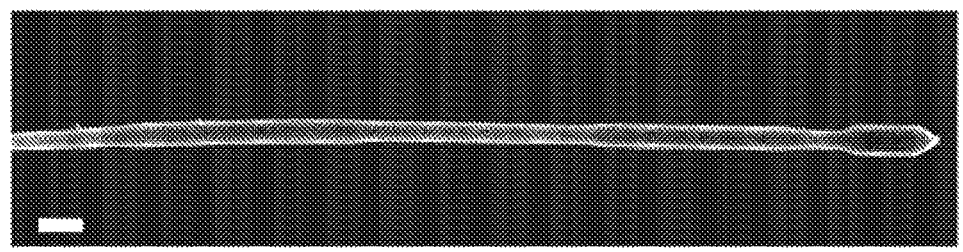
FIGS. 8A-8D illustrate pitch as a function of flow rate, in some embodiments of the invention.
Figure 8B:
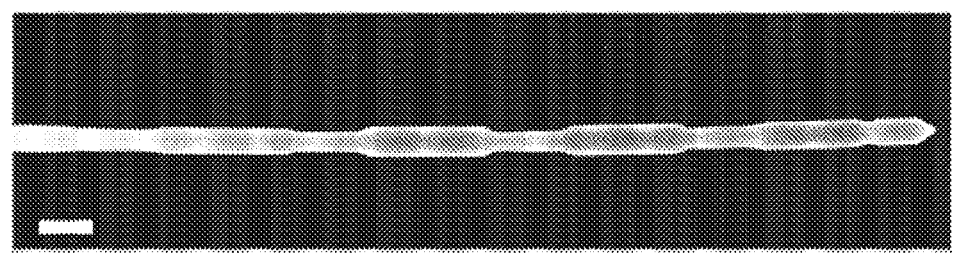
Figure 8C:
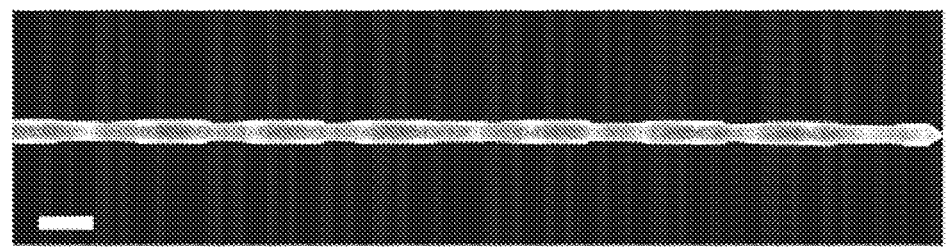
Figure 8D:
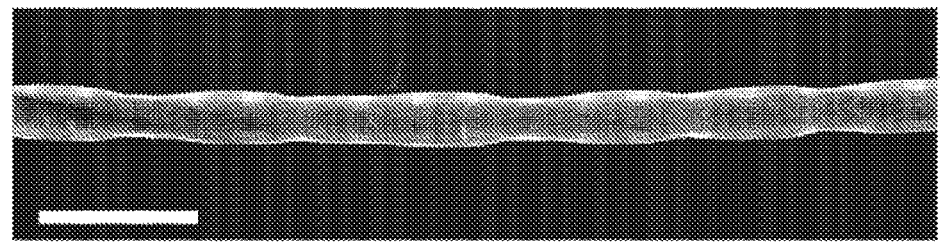
Figure 9A:
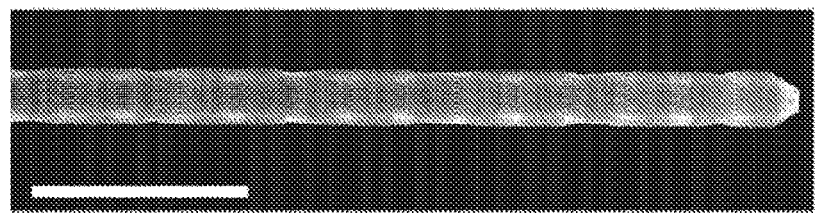
FIGS. 9A-9D illustrate pitch as a function of temperature, in certain embodiments of the invention.
Figure 9B:
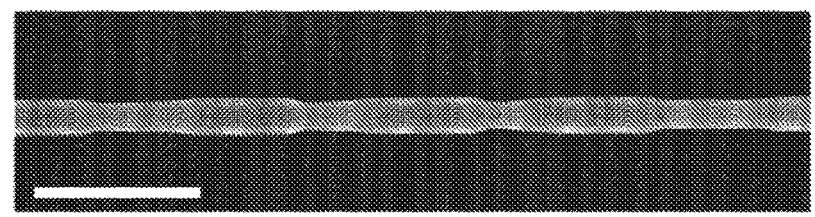
Figure 9C:
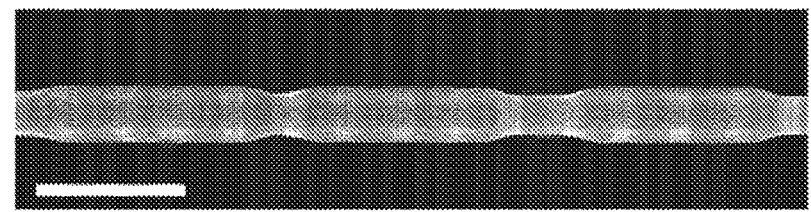
Figure 9D:
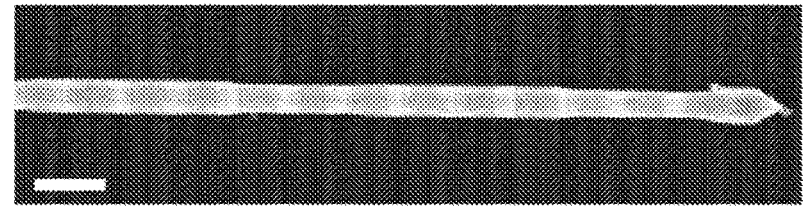

In one set of embodiments, the shell may be grown around the core by flowing or passing the shell material 45, or a precursor thereof, along the core, as is shown in FIG. 7B. In some cases, shell material (or precursor) may be present within a fluid (e.g., a liquid, a gas, plasma, etc.), and in some cases, the fluid may be under relatively low pressures, as discussed below. As the fluid passes past core 20, some of the shell material 45 can deposit or form onto the core. Under certain conditions as discussed herein, instabilities may be created, such as in Plateau-Raleigh crystal growth. Without wishing to be bound by any theory, it is believed that under certain conditions, certain materials have a tendency to minimize surface area as they deposit onto a substrate. For example, under some flow conditions as discussed herein, a shell material depositing or forming onto a nanoscale wire surface will deposit or form in a way such that the shell material tries to minimize its surface area. The shell material may thus be formed as discontinuous sections, or sections having different cross-sectional areas 30 on the core 20, as it minimizes its surface area. See also FIG. 7A, showing shell deposition on a core as a function of time, or FIG. 2, showing pitches with silicon shells on silicon cores of between about 1 to 10 micrometers. Other pitches are also possible, as discussed herein.

It should be understood that Plateau-Rayleigh instability is not synonymous with Plateau-Rayleigh crystal growth. Generally, Plateau-Rayleigh instability is the transformation of a 1-dimensional liquid-state object into periodically spaced liquid-state spheres, where the pitch is limited to about 4 times the diameter of the original liquid object. This can be observed, for example, in a stream of water from a faucet that eventually breaks apart into separated droplets. This breaking up into droplets is Plateau-Rayleigh instability. Plateau-Rayleigh crystal growth, however, is the growth of a solid-state crystal on solid-state objects, such as solid-state 1-dimensional objects, where the pitch between these shells is determined by the reaction conditions.

As mentioned, various aspects of the present invention are generally directed to nanoscale wires having a core and one or more shell regions surrounding at least a portion of the core. The core is typically a nanowire, or other suitable nanoscale wire such as those discussed herein. In one set of embodiments, the core has at least one cross-sectional dimension and, in some embodiments, two orthogonal cross-sectional dimensions (e.g., a diameter) of less than 1 micrometer, less than about 500 nm, less than about 200 nm, less than about 150 nm, less than about 100 nm, less than about 70, less than about 50 nm, less than about 20 nm, less than about 10 nm, less than about 5 nm, than about 2 nm, or less than about 1 nm. In some embodiments, the core is generally cylindrical. In other embodiments, however, other shapes are possible; for example, the core can be faceted, i.e., the core may have a polygonal cross-section. The cross-section of a core can be any arbitrary shape, including, but not limited to, circular, square, rectangular, annular, polygonal, or elliptical, and may be a regular or an irregular shape. The core may be solid or hollow. In some embodiments, the core may have a substantially uniform profile or cross-sectional area, or have a variation in average diameter of less than about 30%, less than about 25%, less than about 20%, less than about 15%, less than about 10%, or less than about 5%.

In some cases, the nanoscale wire forming the core has one dimension that is substantially longer than the other dimensions of the nanoscale wire. For example, the nanoscale wire may have a longest dimension that is at least about 1 micrometer, at least about 3 micrometers, at least about 5 micrometers, or at least about 10 micrometers or about 20 micrometers in length, and/or the nanoscale wire may have an aspect ratio (longest dimension to shortest orthogonal dimension) of greater than about 2:1, greater than about 3:1, greater than about 4:1, greater than about 5:1, greater than about 10:1, greater than about 25:1, greater than about 50:1, greater than about 75:1, greater than about 100:1, greater than about 150:1, greater than about 250:1, greater than about 500:1, greater than about 750:1, or greater than about 1000:1 or more in some cases.

The core may be formed out of any of a wide variety of materials. For instance, in one set of embodiments, the core may comprise or consist essentially of a semiconductor material. However, it should be understood that the core can comprise other materials as well in other embodiments of the invention. For example, in one set of embodiments, the core may comprise or consist essentially of a metal. In some cases, at least about 80%, at least about 85%, at least about 90%, at least about 95%, or 100% of the core (by mass) is a metal. Non-limiting examples of potentially suitable metals include aluminum, gold, silver, copper, molybdenum, tantalum, titanium, nickel, tungsten, chromium, platinum, or palladium. Techniques for producing metal nanoscale wires are known to those of ordinary skill in the art, and include, for instance solution processing techniques such as solution-phase synthesis, template fabrication techniques, chemical vapor deposition (CVD), or the like. In some cases, metal nanowires may be obtained commercially. The core may include one or more than one metals (e.g., alloyed together).

In another set of embodiments, the core may comprise or consist essentially of a dielectric material. For example, the core may comprise a nitride, such as $Si_3N_4$, or the core may comprise an oxide, such as a semiconductor oxide or a metal oxide. In one embodiment, the semiconductor oxide is $SiO_2$. In another embodiment, the semiconductor oxide is $GeO_2$. In still other embodiments, the oxide may be $SeO_2$, $SnO_2$, $GaO_2$, $TiO_2$, $Al_2O_3$, $HfO_2$, $NiO_2$, $NiO$, $BaTiO_3$, $SrTiO_3$, $Fe_3O_4$, $Fe_2O_3$, $MgO$, $Cr_2O_3$, $ZnO$, $MgO$, $VO_2$, $V_2O_5$, $MnO$, $CO_2O_3$, $CO_3O_4$, $CuO$, $Cu_2O$, $ZrO_2$, $BaO$, $WO_2$, $CeO_2$, or the like. The core may also comprise other dielectric materials, such as NdFeB, or any other suitable material that is dielectric. Combinations of any of these are also possible in some cases, e.g., the semiconductor oxide may comprise $SiO_2$ and $GeO_2$, $SiO_2$ and $SeO_2$, etc. In some cases, at least about 80%, at least about 85%, at least about 90%, at least about 95%, or 100% of the core (by mass) is a semiconductor oxide. Techniques for producing semiconductor oxide nanoscale wires that can be used as a core will be known to those of ordinary skill in the art, and include, for instance, solution processing techniques, template fabrication techniques, chemical vapor deposition (CVD), or the like.

In yet another set of embodiments, the nanoscale wire core may comprise or consist essentially of a polymer. Examples of polymers include, but are not limited to, polyaniline, polypyrrole, polythiophene, polystyrene, polypropylene, polyester, poly(methyl methacrylate), polyacrylamide, DNA, RNA, SU-8, poly(p-phenylene vinylene), poly(vinylchloride), nylon (e.g., nylon 6, nylon 6,6, etc.), polyurethane, silk, polyphosphazene, low density polyethylene, high density polyethylene, polypropylene, thermoplastic polyurethanes, polychlorotrifluoroethylene, polyvinylidene fluoride, polyvinylidene chloride, polysiloxane, polyethylene, polytetrafluoroethylene, poly(ethylene terephthalate), poly(ethylene oxide), and/or derivatives thereof, etc. In some cases, at least about 80%, at least about 85%, at least about 90%, at least about 95%, or 100% of the core (by mass) is a polymer. Polymeric nanoscale wires that can be used as a core can be prepared using techniques known to those of ordinary skill in the art, such as solution processing techniques, template fabrication techniques, chemical polymerization techniques, etching techniques such as ion etching or plasma etching, or by sol-gel chemistry, etc.

In still another set of embodiments, the nanoscale wire core may comprise or consist essentially of a semiconductor material. For example, the nanoscale wire may comprise silicon. In some cases, the nanoscale wire may comprise germanium. Other suitable semiconductor materials include those discussed herein. In some cases, at least about 80%, at least about 85%, at least about 90%, at least about 95%, or 100% of the core (by mass) is a semiconductor. Typically, a semiconductor is an element having semiconductive or semi-metallic properties (i.e., between metallic and non-metallic properties). Non-limiting examples include elemental semiconductors, such as silicon, gallium, germanium, diamond (carbon), tin, selenium, tellurium, boron, or phosphorous. In other embodiments, more than one element may be present, for example, gallium arsenide, gallium nitride, indium phosphide, cadmium selenide, etc. Still other examples include a Group II-VI material (which includes at least one member from Group II of the Periodic Table and at least one member from Group VI, for example, ZnS, ZnSe, ZnSSe, ZnCdS, CdS, or CdSe), or a Group III-V material (which includes at least one member from Group III and at least one member from Group V, for example GaAs, GaP, GaAsP, InAs, InP, AlGaAs, or InAsP).

Any suitable technique may be used to produce a semiconductor nanoscale wire core, including etching techniques such as ion etching or plasma etching, vapor-liquid-solid (VLS) synthesis, chemical vapor deposition (CVD) techniques, solution-phase synthesis, supercritical fluid-liquid-solid growth, or techniques such as those disclosed in U.S. Pat. No. 7,211,464 incorporated herein by reference in its entirety. As another example, the core may be grown from substantially uniform nanoclusters or particles, e.g., colloid particles. See, e.g., U.S. Pat. No. 7,301,199, issued Nov. 27, 2007, entitled "Nanoscale Wires and Related Devices," by Lieber, et al., incorporated herein by reference in its entirety. Other techniques suitable for producing nanoscale wires are also known to those of ordinary skill in the art.

In certain embodiments, the semiconductor can be undoped or doped (e.g., p-type or n-type). For example, in one set of embodiments, a nanoscale wire may be a p-type semiconductor nanoscale wire or an n-type semiconductor nanoscale wire. In some embodiments, a dopant or a semiconductor may include mixtures of Group IV elements, for example, a mixture of silicon and carbon, or a mixture of silicon and germanium. In other embodiments, the dopant or the semiconductor may include a mixture of a Group III and a Group V element, for example, BN, BP, BAs, AlN, AlP, AlAs, AlSb, GaN, GaP, GaAs, GaSb, InN, InP, InAs, or InSb. Mixtures of these may also be used, for example, a mixture of BN/BP/BAs, or BN/AlP. In other embodiments, the dopants may include alloys of Group III and Group V elements. For example, the alloys may include a mixture of AlGaN, GaPAs, InPAs, GaInN, AlGaInN, GaInAsP, or the like. In other embodiments, the dopants may also include a mixture of Group II and Group VI semiconductors. For example, the semiconductor may include ZnO, ZnS, ZnSe, ZnTe, CdS, CdSe, CdTe, HgS, HgSe, HgTe, BeS, BeSe, BeTe, MgS, MgSe, or the like. Alloys or mixtures of these dopants are also be possible, for example, (ZnCd)Se, or Zn(SSe), or the like. Additionally, alloys of different groups of semiconductors may also be possible, for example, a combination of a Group II-Group VI and a Group III-Group V semiconductor, for example, $(GaAs)_x(ZnS)_{1-x}$. Other examples of dopants may include combinations of Group IV and Group VI elements, such as GeS, GeSe, GeTe, SnS, SnSe, SnTe, PbO, PbS, PbSe, or PbTe. Other semiconductor mixtures may include a combination of a Group I and a Group VII, such as CuF, CuCl, CuBr, CuI, AgF, AgCl, AgBr, AgI, or the like. Other dopant compounds may include different mixtures of these elements, such as $BeSiN_2$, $CaCN_2$, $ZnGeP_2$, $CdSnAs_2$, $ZnSnSb_2$, $CuGeP_3$, $CuSi_2P_3$, $Si_3N_4$, $Ge_3N_4$, $Al_2O_3$, $(Al, Ga, In)_2(S, Se, Te)_3$, $Al_2CO$, $(Cu, Ag)(Al, Ga, In, Tl, Fe)(S, Se, Te)_2$ and the like.

The doping of the semiconductor to produce a p-type or n-type semiconductor core may be achieved via bulk-doping in certain embodiments, although in other embodiments, other doping techniques (such as ion implantation) can be used. Many such doping techniques that can be used will be familiar to those of ordinary skill in the art, including both bulk doping and surface doping techniques. A bulk-doped article (e.g. an article, or a portion or region of an article) is an article for which a dopant is incorporated substantially throughout the crystalline lattice of the article, as opposed to an article in which a dopant is only incorporated in particular regions of the crystal lattice at the atomic scale, for example, only on the surface or exterior. For example, some articles are typically doped after the base material is grown, and thus the dopant only extends a finite distance from the surface or exterior into the interior of the crystalline lattice. It should be understood that "bulk-doped" does not define or reflect a concentration or amount of doping in a semiconductor, nor does it necessarily indicate that the doping is uniform. "Heavily doped" and "lightly doped" are terms the meanings of which are clearly understood by those of ordinary skill in the art. In some embodiments, one or more regions comprise a single monolayer of atoms ("delta-doping"). In certain cases, the region may be less than a single monolayer thick (for example, if some of the atoms within the monolayer are absent). As a specific example, the regions may be arranged in a layered structure within the nanoscale wire, and one or more of the regions can be delta-doped or partially delta-doped.

In some embodiments, the nanoscale wire core has a conductivity of or of similar magnitude to any semiconductor or any metal. The nanoscale wire can be formed of suitable materials, e.g., semiconductors, metals, etc., as well as any suitable combinations thereof. In some cases, the nanoscale wire will have the ability to pass electrical charge, for example, being electrically conductive. For example, the nanoscale wire may have a relatively low resistivity, e.g., less than about $10^{-3}$ Ohm m, less than about $10^{-4}$ Ohm m, less than about $10^{-6}$ Ohm m, or less than about $10^{-7}$ Ohm m. The nanoscale wire can, in some embodiments, have a conductance of at least about 1 microsiemens, at least about 3 microsiemens, at least about 10 microsiemens, at least about 30 microsiemens, or at least about 100 microsiemens.

The nanoscale wire core can be solid or hollow, in various embodiments. As used herein, a "nanotube" is a nanoscale wire that is hollow, or that has a hollowed-out core, including those nanotubes known to those of ordinary skill in the art. As another example, a nanotube may be created by creating a core/shell nanowire, then etching away at least a portion of the core to leave behind a hollow shell. Accordingly, in one set of embodiments, the nanoscale wire is a non-carbon nanotube. In contrast, a "nanowire" is a nanoscale wire that is typically solid (i.e., not hollow). Thus, in one set of embodiments, the nanoscale wire may be a semiconductor nanowire, such as a silicon nanowire.

In one set of embodiments, the nanoscale wire may include a heterojunction, e.g., of two regions with dissimilar materials or elements, and/or the same materials or elements but at different ratios or concentrations. The regions of the nanoscale wire may be distinct from each other with minimal cross-contamination, or the composition of the nanoscale wire can vary gradually from one region to the next. The regions may be both longitudinally arranged relative to each other, or radially arranged (e.g., as in a core/shell arrangement) on the nanoscale wire. Each region may be of any size or shape within the wire. The junctions may be, for example, a p/n junction, a p/p junction, an n/n junction, a p/i junction (where i refers to an intrinsic semiconductor), an n/i junction, an i/i junction, or the like. The junction can also be a Schottky junction in some embodiments. The junction may also be, for example, a semiconductor/semiconductor junction, a semiconductor/metal junction, a semiconductor/insulator junction, a metal/metal junction, a metal/insulator junction, an insulator/insulator junction, or the like. The junction may also be a junction of two materials, a doped semiconductor to a doped or an undoped semiconductor, or a junction between regions having different dopant concentrations. The junction can also be a defected region to a perfect single crystal, an amorphous region to a crystal, a crystal to another crystal, an amorphous region to another amorphous region, a defected region to another defected region, an amorphous region to a defected region, or the like. More than two regions may be present, and these regions may have unique compositions or may comprise the same compositions. As one example, a wire can have a first region having a first composition, a second region having a second composition, and a third region having a third composition or the same composition as the first composition. Non-limiting examples of nanoscale wires comprising heterojunctions (including core/shell heterojunctions, longitudinal heterojunctions, etc., as well as combinations thereof) are discussed in U.S. Pat. No. 7,301,199, issued Nov. 27, 2007, entitled "Nanoscale Wires and Related Devices," by Lieber, et al., incorporated herein by reference in its entirety.

In one set of embodiments, the nanoscale wire core is formed from a single crystal, for example, a single crystal nanoscale wire comprising a semiconductor. A single crystal item may be formed via covalent bonding, ionic bonding, or the like, and/or combinations thereof. While such a single crystal item may include defects in the crystal in some cases, the single crystal item is distinguished from an item that includes one or more crystals, not ionically or covalently bonded, but merely in close proximity to one another. The single crystal may be one that contains no grain boundaries, although it may contain defects, dislocations, impurities, etc. in some cases. However, in other embodiments, the core may be composed of crystallites, the core may be polycrystalline or single crystalline, etc.

In some embodiments, the nanoscale wires used herein are individual or free-standing nanoscale wires. For example, an "individual" or a "free-standing" nanoscale wire may, at some point in its life, not be attached to another article, for example, with another nanoscale wire, or the free-standing nanoscale wire may be in solution. This is in contrast to nanoscale features etched onto the surface of a substrate, e.g., a silicon wafer, in which the nanoscale features are never removed from the surface of the substrate as a free-standing article. This is also in contrast to conductive portions of articles which differ from surrounding material only by having been altered chemically or physically, in situ, i.e., where a portion of a uniform article is made different from its surroundings by selective doping, etching, etc. An "individual" or a "free-standing" nanoscale wire is one that can be (but need not be) removed from the location where it is made, as an individual article, and transported to a different location and combined with different components to make a functional device such as those described herein and those that would be contemplated by those of ordinary skill in the art upon reading this disclosure.

The core may be surrounded by one or more shell materials. These shell materials may be deposited or formed onto the core, in one aspect of the invention, by deposition techniques where a fluid, such as a liquid and/or a gas, flows or passes by a core, e.g., in a longitudinal direction relative to the core, as is shown in FIG. 7B. Some of the shell material (or a precursor of the shell material) can deposit on the core, e.g., to form one or more shells surrounding at least a portion of the core. This deposition may not necessarily occur uniformly. Rather, the deposition of the shell materials or precursors may be performed under conditions that cause nonuniform deposition or formation of the shell materials. For instance, the shell materials may deposit or form as a series of discontinuous regions separated by regions of the core that do not contain any deposits (or any substantial deposits) of the shell material. In some cases, the shell materials or precursors may deposit such that the surface area is relatively minimized and the shell material is concentrated or located in certain regions along the core. For instance, as discussed in more detail below, reaction conditions may be applied to create conditions in which the shell material seeks to minimize surface area, e.g., such that Plateau-Rayleigh crystal growth occurs.

The shell regions may be discontinuous and separated along the nanoscale wire in certain embodiments. For instance, one shell region may be separated from its next nearest shell region by a distance along the core of at least about 1 nm, at least about 3 nm, at least about 5 nm, at least about 7 nm, at least about 10 nm, at least about 15 nm, at least about 30 nm, at least about 50 nm, at least about 75 nm, at least about 100 nm, at least about 200 nm, at least about 300 nm, at least about 500 nm, at least about 750 nm, at least about 1 micrometer, at least about 2 micrometers, at least about 3 micrometers, at least about 4 micrometers, at least about 5 micrometers, at least about 6 micrometers, at least about 7 micrometers, at least about 8 micrometers, at least about 10 micrometers, at least about 15 micrometers, at least about 20 micrometers, at least about 30 micrometers, at least about 50 micrometers, at least about 75 micrometers, or more in some cases. In some cases, the distance of separation may be no more than about 100 micrometers, no more than about 75 micrometers, no more than about 50 micrometers, no more than about 30 micrometers, no more than about 20 micrometers, no more than about 15 micrometers, no more than about 10 micrometers, no more than about 8 micrometers, no more than about 7 micrometers, no more than about 6 micrometers, no more than about 5 micrometers, no more than about 4 micrometers, no more than about 3 micrometers, no more than about 2 micrometers, no more than about 1 micrometer, no more than about 750 nm, no more than about 500 nm, no more than about 300 nm, no more than about 200 nm, no more than about 100 nm, no more than about 75 nm, no more than about 50 nm, no more than about 30 nm, no more than about 15 nm, no more than about 10 nm, no more than about 7 nm, no more than about 5 nm, or no more than about 3 nm. Combinations of any of these are also possible; for instance, two shell regions may be separated by a distance of separation between about 1 micrometer and about 5 micrometers.

In some cases, the shells may be substantially regularly spaced along the core. It should be understood that in reality, the spacing may not necessarily be perfect, but there may be some variation in the spacing. The average spacing between shells may be referred to as the "pitch" of the shells, and is usually measured from the leading edge of one shell region to the leading edge of the next shell region (see, e.g., FIG. 1A). Multiple such distances may also be averaged together to determine the average pitch. In some embodiments, the pitch may fall within any of the ranges given above for the distance of separation, e.g., in one set of embodiments, the pitch may be between about 1 micrometer and about 5 micrometers. However, as mentioned, it should be understood that the average spacing or pitch is an average, and individual shell regions may be closer or farther away. For instance, there may be a standard deviation or variation of at least about 3%, at least about 5%, at least about 10%, at least about 15%, at least about 20%, at least about 25% of the mean value of the pitch.

These shell regions may be spherical in some embodiments (which would represent an idealized minimal state), but in other embodiments, the regions can be non-spherical. For instance, in some cases, the shell material (or precursor thereof) may deposit as a crystal, and in some cases, the depositions may be monocrystalline or substantially monocrystalline, e.g., without discrete domains or grain boundaries within a single shell region. Thus, in some embodiments, a shell region is a single crystal. In some cases, due to the crystallinity, the regions may deposit non-spherically. For example, as is shown in FIG. 3D, the regions may deposit with generally square or rectangular cross-sectional areas, or with areas having an aspect ratio (i.e., of two dimensions orthogonal to the longitudinal direction) of at least about 1.3:1, at least about 1.5:1, at least about 1.8:1, at least about 2:1, at least about 2.5:1, at least about 3:1, at least about 4:1, at least about 5:1, etc.

In some cases, the shell regions comprise a portion that has a substantially uniform cross-sectional area, relative to the longitudinal direction along the nanoscale wire core. Optionally, the regions may also comprise portions that do not have a uniform cross-sectional area, which can be understood to be a transition portion, e.g., as shown in a cross-sectional view in FIG. 13B. In some embodiments, a shell region may have a portion having a uniform cross-sectional area having a maximum dimension (orthogonal to the core) of greater than about 10 nm, greater than about 30 nm, greater than about 50 nm, greater than about 75 nm, greater than about 100 nm, greater than about 150 nm, greater than about 200 nm, greater than about 250 nm, greater than about 300 nm, greater than about 350 nm, greater than about 400 nm, greater than about 450 nm, greater than about 500 nm, greater than about 600 nm, greater than about 700 nm, greater than about 800 nm, greater than about 900 nm, greater than about 1 micrometer, greater than about 2 micrometers, greater than about 3 micrometers, greater than about 4 micrometers, or greater than about 5 micrometers. In addition, in some cases, the dimension may be less than about 5 micrometers, less than about 4 micrometers, less than about 3 micrometers, less than about 2 micrometers, less than about 1 micrometer, less than about 900 nm, less than about 800 nm, less than about 700 nm, less than about 600 nm, less than about 500 nm, less than about 450 nm, less than about 400 nm, less than about 350 nm, less than about 300 nm, less than about 250 nm, less than about 200 nm, less than about 100 nm, less than about 75 nm, less than about 50 nm, less than about 30 nm, less than about 10 nm, etc. Combinations of any of these are also possible in some embodiments; for instance, a shell region may have a dimension orthogonal to the core of between about 100 nm and about 400 nm. In addition, as mentioned, the shell material may also have a substantially circular cross-sectional area, or have other geometries or other various aspect ratios. Dimensions of the core are discussed elsewhere herein, and can be combined with any of these dimensions (or other dimensions as described herein) of the shell, in certain embodiments.

The shell regions may also have a length determined longitudinally along the core of at least about 1 nm, at least about 3 nm, at least about 5 nm, at least about 7 nm, at least about 10 nm, at least about 15 nm, at least about 30 nm, at least about 50 nm, at least about 75 nm, at least about 100 nm, at least about 200 nm, at least about 300 nm, at least about 500 nm, at least about 750 nm, at least about 1 micrometer, at least about 2 micrometers, at least about 3 micrometers, at least about 4 micrometers, at least about 5 micrometers, at least about 6 micrometers, at least about 7 micrometers, at least about 8 micrometers, at least about 10 micrometers, at least about 15 micrometers, or more in some cases. In some cases, the length may be no more than about 20 micrometers, no more than about 15 micrometers, no more than about 10 micrometers, no more than about 8 micrometers, no more than about 7 micrometers, no more than about 6 micrometers, no more than about 5 micrometers, no more than about 4 micrometers, no more than about 3 micrometers, no more than about 2 micrometers, no more than about 1 micrometer, no more than about 750 nm, no more than about 500 nm, no more than about 300 nm, no more than about 200 nm, no more than about 100 nm, no more than about 75 nm, no more than about 50 nm, no more than about 30 nm, no more than about 15 nm, no more than about 10 nm, no more than about 7 nm, no more than about 5 nm, or no more than about 3 nm. Combinations of any of these are also possible. For example, in one embodiment, the shell may have a length of between about 1 micrometer and about 2 micrometers.

In certain embodiments, the nanoscale wire (including the core and shell) has a maximum dimension, orthogonal to the core, of less than about 5 micrometers, less than about 4 micrometers, less than about 3 micrometers, less than about 2 micrometers, less than about 1 micrometer, less than about 900 nm, less than about 800 nm, less than about 700 nm, less than about 600 nm, less than about 500 nm, less than about 450 nm, less than about 400 nm, less than about 350 nm, less than about 300 nm, less than about 250 nm, less than about 100 nm, less than about 75 nm, less than about 50 nm, less than about 30 nm, less than about 10 nm, etc.

In some embodiments, the shell region may also contain one or more transition portions, e.g., regions that do not have a uniform cross-sectional area. Typically, the transition portion may be positioned between the shell region and regions of the nanoscale wire core that are substantially free of such shell portions (or have smaller shell portions). In some cases, the transition portion may have a length, determined along the core, of at least about 5 nm, at least about 10 nm, at least about 20 nm, at least about 30 nm, at least about 50 nm, at least about 100 nm, etc. In addition, in certain embodiments, the transition portion may have a length of no more than about 100 nm, no more than about 50 nm, no more than about 30 nm, no more than about 20 nm, no more than about 10 nm, etc. These may also be combined together in certain embodiments. For example, the transition portion of the shell region may have a longitudinal length of between about 10 nm and about 30 nm.

Figure 13B:
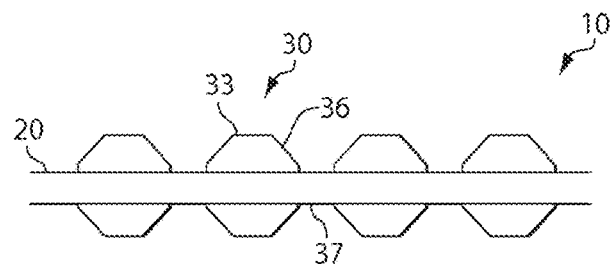
Figure 13C:
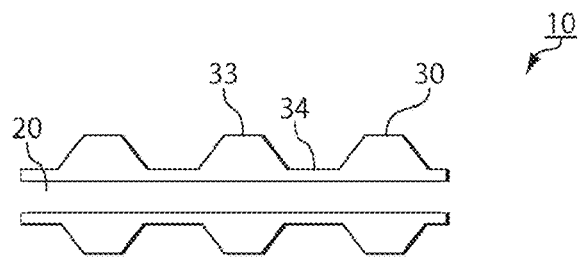

For instance, referring to FIG. 13B, a nanoscale wire may comprise a plurality of periodic shell regions 30 surrounding a core, where the shell regions are separated by regions 37. The shell regions may comprise a first portion 33 with a substantially cross-sectional area, and a second transition portion 36 that does not have a substantially cross-sectional area. It should be understood that FIG. 13B is a schematic diagram, and the transition portions may not necessarily be perfectly linear or crystalline. See, e.g., FIG. 1C for examples of nanoscale wires having transition portions. In addition, in some embodiments, there may not be separate shell regions surrounding the core, but instead the shell regions may be present as having variations in thickness, e.g., as is shown in FIG. 13C with first portions 33 and second portions 34 around core 20. One or both portions may have substantially uniform cross-sectional areas, where first portion 33 is larger than second portion 34. These may also be periodically spaced in some embodiments, e.g., at the pitches described herein.

The shell regions may be formed out of any suitable material, and may independently be the same or different from the core. For instance, the shell region may comprise a semiconductor (e.g., silicon, germanium, indium phosphide, etc.), a semiconductor oxide (e.g., silicon dioxide), a metal (e.g., Ni, Pt, Au, etc.), a polymer (e.g., polyaniline, polypyrrole, etc.), or the like. Examples of these and other materials have been previously described above. In addition, in some cases, the shell region may be present as a single crystal. The shell region may also be substantially crystalline, substantially monocrystalline, polycrystalline, single crystalline, or composed of crystallites, etc. In addition, it should be noted that the crystallinity of the core and of the shell may independently be the same or different.

It addition, it should be noted that in some cases, fabricating core and shell regions with different materials results in lattice mismatches, especially where the core and the shell are crystalline or monocrystalline. In some embodiments, under conditions such as Plateau-Raleigh crystal growth, long surface diffusion length of the shell material on the surface of the nanoscale wire may be required in some embodiments, which could potentially result in failure of the shell material to deposit on the surface of the nanoscale wire. However, surprisingly, it has been found that under some conditions, e.g., with relatively small shell regions, non-homogenous deposition can still occur despite the lattice mismatches.

Figure 14:
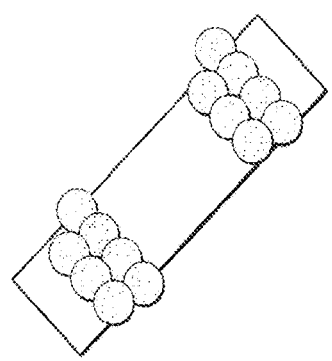
FIG. 14 is a schematic diagram of a nanoscale wire comprising nanoparticles.

In addition, in one set of embodiments, the shell region may comprise a plurality of nanoparticles. For instance, as discussed below, in one set of embodiments, a fluid containing nanoparticles may be passed along a nanoscale wire, and nanoparticles may deposit onto the nanoscale wire, forming shell regions of nanoparticles around the nanoscale wire, such as is shown in FIG. 14.

In some cases the nanoparticles may have an average diameter of less than about 1 mm, less than about 500 micrometers, less than about 200 micrometers, less than about 100 micrometers, less than about 75 micrometers, less than about 50 micrometers, less than about 25 micrometers, less than about 10 micrometers, or less than about 5 micrometers in some cases. The average diameter may also be at least about 1 micrometer, at least about 2 micrometers, at least about 3 micrometers, at least about 5 micrometers, at least about 10 micrometers, at least about 15 micrometers, or at least about 20 micrometers in certain cases. The nanoparticles may be, for example, metallic, polymeric, ceramic, or the like. Examples of polymeric nanoparticles include, but are not limited to, poly(methyl methacrylate), poly(vinyl alcohol), poly(acrylic acid), polyacrylamide, polymethacrylic acid, polycaprolactone, polylactide, polyglycolide, etc. Examples of metallic nanoparticles include, but are not limited to, gold, silver, copper, platinum, or palladium nanoparticles. Many such nanoparticles are commercially available.

Another aspect of the present invention is generally directed to systems and methods of making nanoscale wires as discussed herein. In one set of embodiments, a fluid containing a shell material (or precursor thereof) is deposited onto a nanoscale wire, or other suitable nanoscale wire. The fluid may be, for example, a liquid, a gas, a plasma, or the like. Combinations of these are also possible, e.g., a mixture of gas and liquid.

A variety of different techniques may be used to flow a material past a nanoscale wire, including physical vapor deposition, CVD, thermal evaporation, liquid flow, sputtering, e-beam evaporation, plasma CVD, or the like. For example, in some embodiments, one or more shell materials (or precursors) are first vaporized into the gaseous phase (e.g., via heat or temperature, chemical reaction, e-beam evaporation, etc.), then the material passes over the nanoscale wire and some of the material deposits onto the nanoscale wire. For example, silane ($SiH_4$) may deposit onto the nanoscale wire as Si, germane ($GeH_4$) may deposit onto the nanoscale wire as Ge, etc. In another set of embodiments, the shell materials (or precursors) may be dissolved or suspended in solution, and deposit onto the surface of the nanoscale wire, e.g., physically or chemically. For example, nanoparticles such as those discussed herein may be suspended in aqueous solution then passed over a nanoscale wire.

As a non-limiting example, in one set of embodiments, a shell material (or precursor thereof) may be deposited onto a nanoscale wire using chemical vapor deposition (CVD). For instance, shell material or precursor may flow past the nanoscale wire (e.g., in a fluid, and/or in vacuum) at a flowrate of less than about 20 sccm, less than about 15 sccm, less than about 10 sccm, less than about 5 sccm, etc. In some cases, the temperature may be at least about 600° C., at least about 650° C., at least about 700° C., at least about 750° C., at least about 800° C., at least about 850° C., at least about 900° C., at least about 950° C., etc. In some cases, the temperature may be less than about 1000° C., less than about 950° C., less than about 900° C., less than about 850° C., less than about 800° C., less than about 750° C., etc. Combinations of these are also possible; for instance, the temperature may be between about 700° C. and about 900° C.

In addition, in some cases, the shell material or precursor may be propelled under vacuum conditions or pressures (e.g., when contained in a fluid). For example, the pressures may be pressures of less than about 100 torr (absolute), less than about 50 torr, less than about 30 torr, less than about 10 torr, less than about 5 torr, less than about 3 ton, less than about 1 torr, etc. In some cases, the fluid may comprise gases such as $H_2$, $N_2$, Ar, He, or Ne.

In one set of embodiments, the shell material or precursor (e.g., in a vacuum, or contained in a fluid) is passed or flowed across the core such that some of the shell material (or precursor) is able to deposit on the core, e.g., to form one or more shell regions. After deposition of the shell material onto the surface, in some cases, there may be some lateral diffusion of the shell material, i.e., on the surface. Under some conditions, once the shell material (or precursor) deposits onto the core (or onto deposited shell materials), the shell material (or precursor) does not immediately become immobilized, but may be able to diffuse on the surface to some extent. For instance, the surface diffusion length of the shell material on the surface of the nanoscale wire may be at least about 5 nm, at least about 10 nm, at least about 30 nm, at least about 50 nm, at least about 100 nm, at least about 300 nm, at least about 500 nm, at least about 750 nm, at least about 1000 nm, etc. The surface diffusion length may be determined using techniques known by those of ordinary skill in the art including, for instance, field ion microscopy or scanning tunneling microscopy. In addition, in some embodiments, the surface diffusion length may be estimated using:

$$\Lambda = a\sqrt{\frac{v_{os}n_o}{J_r}}\, e^{-E_s/2RT},$$

where lambda ($\Lambda$) is the diffusion length, alpha ($\alpha$) is the adatom hop distance, or the distance between two neighboring equilbrium positions of adatoms while they are diffusing, nu ($v_{os}$) is a pre-exponential frequency factor, $n_o$ is the areal density of adsorption sites, $J_r$ is the deposition flux of the precursor gas onto the surface, $E_s$ is the activation energy for diffusion, R is the gas constant, and T is the temperature.

If the surface diffusion length of the shell material is relatively large, and/or if the shell material has the ability to diffuse along the surface of the nanoscale wire, then in some cases, the diffusion of the shell material on the surface of the nanoscale wire (e.g., on the core and/or the shell material) may occur such that the shell material reaches a lower energy state where its exposed surface area is minimized. Surprisingly, the minimal state does not occur when the core is uniformly coated with a homogeneous shell, but instead, the minimal state is a state where the shell material is concentrated in certain regions (generally spherical) along the core, for instance, where a given surface area encompasses the largest possible internal volume. It is surprising that such a phenomenon could be exploited in the nanoscale wire context to produce nanoscale wires having non-uniformly deposited shell, as is discussed herein, or in other solid materials. Plateau-Rayleigh crystal growth has not previously been observed in solids, or in the growth of crystals on a solid object, e.g., on the core of a nanowire.

Another aspect of the present invention includes the ability to fabricate essentially any electronic device from any of the nanoscale wires discussed herein, for a variety of applications, including but not limited to electronics, optical, thermal, or mechanical applications. This includes any device that can be made in accordance with this aspect of the invention that one of ordinary skill in the art would desirably make. Examples of such devices include, but are not limited to, field effect transistors (FETs), bipolar junction transistors (BJTs), tunnel diodes, modulation doped superlattices, complementary inverters, light emitting devices, light sensing devices, biological system imagers, biological and chemical detectors or sensors, thermal or temperature detectors, Josephine junctions, nanoscale light sources, photodetectors such as polarization-sensitive photodetectors, gates, inverters, AND, NAND, NOT, OR, TOR, and NOR gates, latches, flip-flops, registers, switches, clock circuitry, static or dynamic memory devices and arrays, state machines, gate arrays, and any other dynamic or sequential logic or other digital devices including programmable circuits. Also included are analog devices and circuitry, including but not limited to, amplifiers, switches and other analog circuitry using active transistor devices, as well as mixed signal devices and signal processing circuitry. Also included are p/n junction devices with low turn-on voltages; p/n junction devices with high turn-on voltages; and computational devices such as a half-adder. In some embodiments, the nanoscale wires of the present invention may be manufactured during the device fabrication process. In other embodiments, the nanoscale wires of the present inventions may first be synthesized, then assembled in a device.

In some cases, the device may be a nanoscale transistor, such as a field effect transistor ("FET") or a bipolar junction transistor ("BJT"). The transistor may have a smallest width of less than 500 nm, less than 100 nm, or other widths as described herein. Any transistor constructed using adjacent regions having different compositions, are contemplated, for example, arranged longitudinally within a single wire, arranged radially within the wire, or the like. In one embodiment, a FET comprising a nanoscale wire may serve as a conducting channel, and an elongated material having a smallest width of less than 500 nm (e.g., a nanoscale wire) serving as the gate electrode. For such a FET, the widths of the nanoscale wire may define a width of the FET. Further, the nanoscale wire may comprise a semiconductor, or have a core/shell arrangement, and such shell may function as a gate dielectric for the FET. In one embodiment, the transistor may be a coaxially-gated transistor.

Such distinct nanometer-scale metrics may lead to significantly improved device characteristics such as high gain, high speed, and low power dissipation. Further, such FETs may be readily integratable, and the assembly of such FETs may be shrunk in a straightforward manner into nanometers scale. Such a "bottom-up" approach may scale down to sizes far beyond what is predicted for traditional "top-down" techniques typically used in the semiconductor industry today. Further, such bottom-up assembly may prove to be far cheaper than the traditional top-down approach.

Electronic devices incorporating semiconductor nanoscale wires may be controlled, for example, using any input signal, such as an electrical, optical or a magnetic signal. The control may involve switching between two or more discrete states or may involve continuous control of nanoscale wire current, i. e., analog control.

The following documents are incorporated herein by reference: U.S. Pat. Nos. 7,129,554, 7,211,464, 7,256,466, 7,301,199, 7,476,596, 7,595,260, 7,666,708, 7,915,151, and 8,153,470; Int. Pat. Apl. Pub. Nos. WO 02/17362, WO 02/48701, and WO 03/005450; and Int. Pat. Apl. No. PCT/US2014/014596, filed Feb. 4, 2014, entitled "Anisotropic Deposition in Nanoscale Wires," by Lieber, et al. In addition, U.S. Provisional Patent Application Ser. No. 61/989,904, filed May 7, 2014, entitled "Controlled Growth of Nanoscale Wires," by Lieber, et al. is incorporated herein by reference.

The following examples are intended to illustrate certain embodiments of the present invention, but do not exemplify the full scope of the invention.

EXAMPLE 1

The Plateau-Rayleigh (PR) instability, as described by Joseph Plateau and Lord Rayleigh in the mid-1800s, describes how a thin column of water can break apart into droplets to minimize its surface tension. The following examples describe certain processes using PR instability to control the growth of crystals on 1-dimensional (1D) materials, a process termed Plateau-Rayleigh Crystal Growth (PRCG). In these examples, Si is deposited onto uniform-diameter Si nanowire (NW) cores to generate diameter-modulated core/shell NW structures. Similarly, Ge can be deposited onto uniform-diameter Ge NW cores. Distinct morphological features of these structures are broadly tunable through rational control of reaction conditions for crystalline shell growth. Analysis of the results reveals that an understanding of both thermodynamic/surface energy driving forces and kinetic control of reaction rates of PR Crystal Growth are necessary to explain the broad range of modulated structures. To date, the design and synthesis of the vast majority of nanoscale wire structures has relied primarily on two general paradigms: axial modulation during core growth and radial modulation during shell growth; PR Crystal Growth represents a fundamentally new general paradigm for generating diameter-modulated nanoscale wire structures with complex morphologies of various materials and sizes.

Figure 1A:
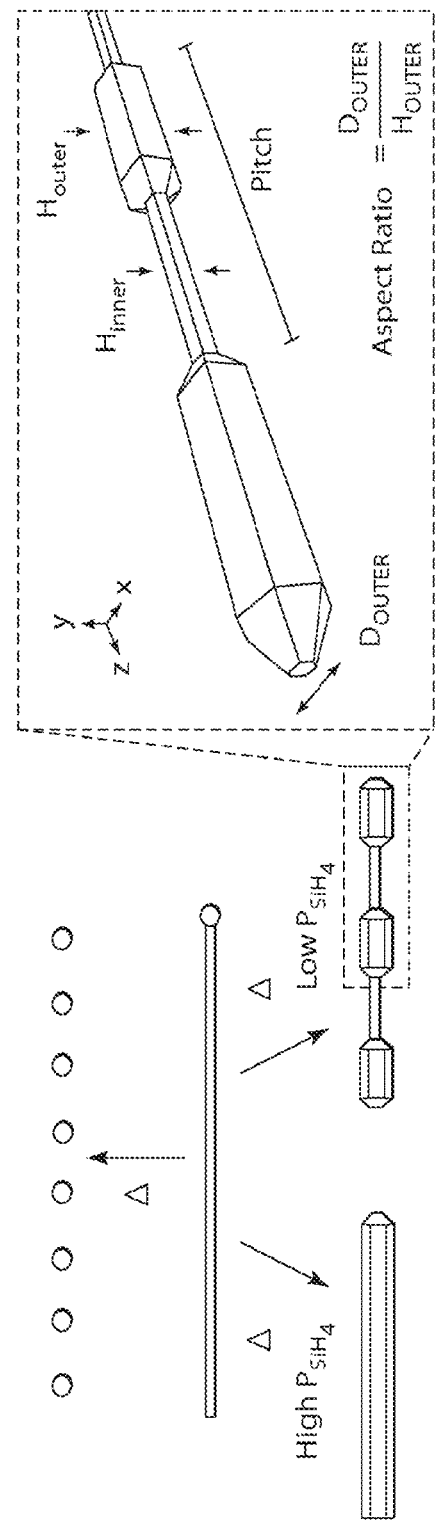
FIGS. 1A-1D illustrate Plateau-Raleigh crystal growth, in certain embodiments of the invention.

At elevated temperatures, 1D NW cores can serve as starting materials for several distinct processes. The introduction of reactive gases can lead to the conformal deposition of crystalline shells as can be seen in FIG. 1A, left. Annealing at low pressures and without reactant gases can transform various NWs into periodically spaced, isolated crystals due to PR instability (FIG. 1A, top). In contrast to conformal deposition, the introduction of reactant gases at lower pressures yields diameter-modulated, periodic shell (PS) NWs with several well-defined morphological features (FIG. 1A, right), including various cross-sectional aspect ratios (AR, or the ratio of the outer diameter to the outer height); modulation amplitudes (ratio of outer diameter to inner diameter); and modulation pitches (length of one inner and outer shell). Importantly, these morphological features are synthetically tunable, as they are sensitive to the reaction conditions used for shell deposition. Although PR instability and PR Crystal Growth both lead to periodically spaced structures starting from 1D materials, they are distinct phenomena; traditional PR instability describes constant volume transformations (i.e. not growth processes) and does not afford tunability in morphology.

Figure 1B:
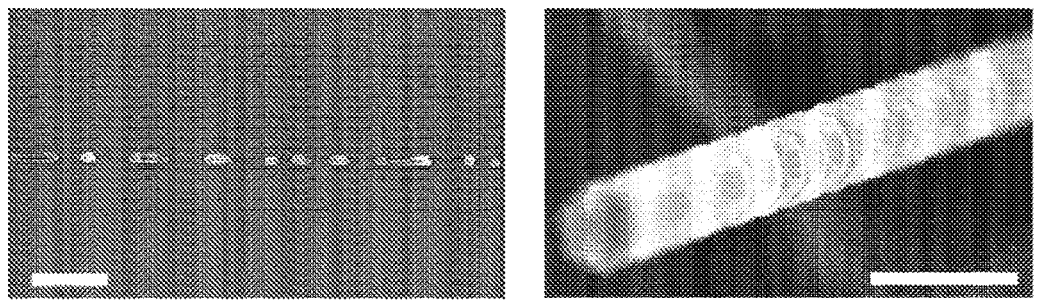
Figure 1C:
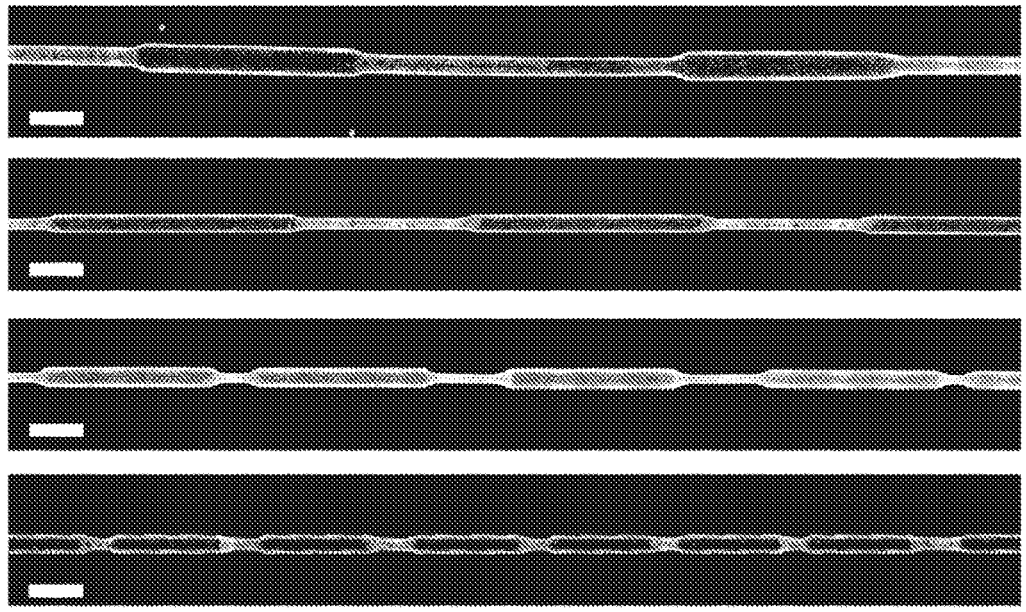
Figure 5:
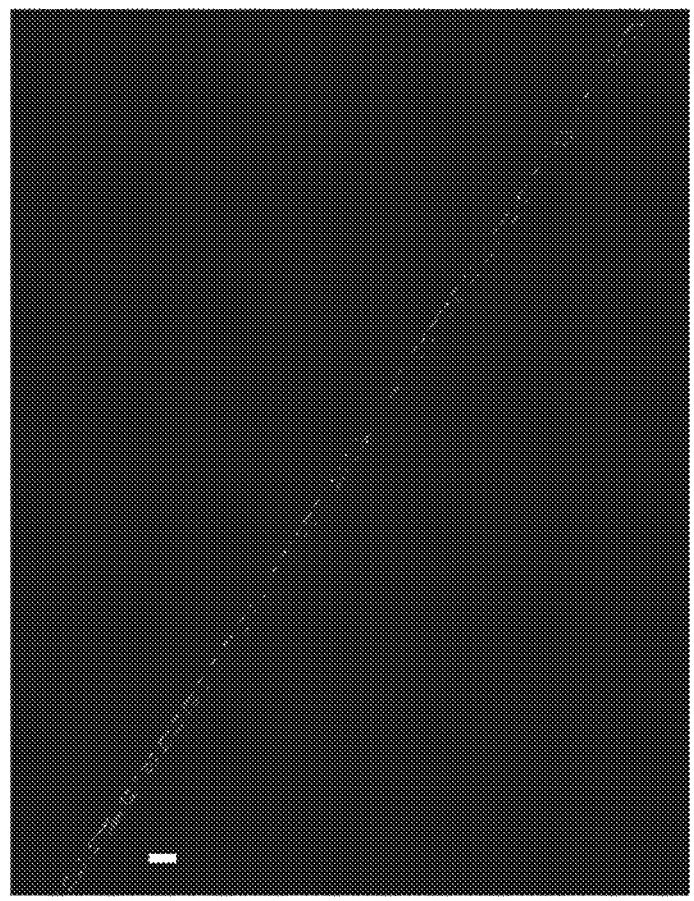
FIG. 5 illustrates a silicon nanoscale wire.

The following examples illustrate conformal core/shell growth, PR instability and PRCG. For these examples, Si NW cores with diameters of 100 nm and lengths of 10 to 60 micrometers were first grown via a Au-catalyzed VLS process by chemical vapor deposition (CVD) at 465° C. See, e.g., U.S. Pat. Nos. 7,211,464; 7,301,199; 7,476,596; 7,595,260; 7,666,708; 7,915,151; or 8,153,470, each incorporated herein by reference. For the first growth, shell growth at 775° C., with a $SiH_4$ partial pressure of ~100 mtorr, and a $H_2$ partial pressure of ~25 torr for ~15 minutes, yielded highly-crystalline, axially-uniform core/shell nanoscale wires. In a second experiment, after core growth, the temperature was increased to >775° C. and the total pressure was reduced to ~0.1 torr. SEM images (FIG. 1B, left) revealed that the cores transformed into particles. The time scales for transformation depended on temperature and core diameter. At 775° C., 100 nm cores began to break up after >14 hours (FIG. 5); at 900° C., the 1D to 0D transformation was complete within 3 minutes (FIG. 1B, left). FIG. 5 shows an annealed 100 nm Si core NW. SEM image of a representative 100 nm Si core NW that was annealed at 775° C. for ~14 hours at −0.2 torr directly following core growth. Scale bar, 200 nm. In a third synthesis, following the growth of 100 nm cores, a $SiH_4$ partial pressure of ~1 mtorr was introduced at 775° C. for ~15 minutes. Head-on SEM images (FIG. 1B, right) revealed NWs with low aspect ratios and diameter modulations that periodically repeat along the axis of the NWs.

To demonstrate the tunability of PRCG, separate core/shell syntheses were performed in which the cores were the same size and grown in the same manner; however, the temperature and/or partial pressure of $SiH_4$ used during shell growth was varied. Plan-view SEM images (FIG. 1C) of NWs transferred to $Si_3N_4$-coated Si substrates showed that the pitch for these diameter modulations strongly depended on shell reaction conditions. It was noted that the yield for observing diameter-modulations on a NW for a given synthesis was ~90% as determined by analyses from optical and SEM images (FIG. 6).

Figure 6A:
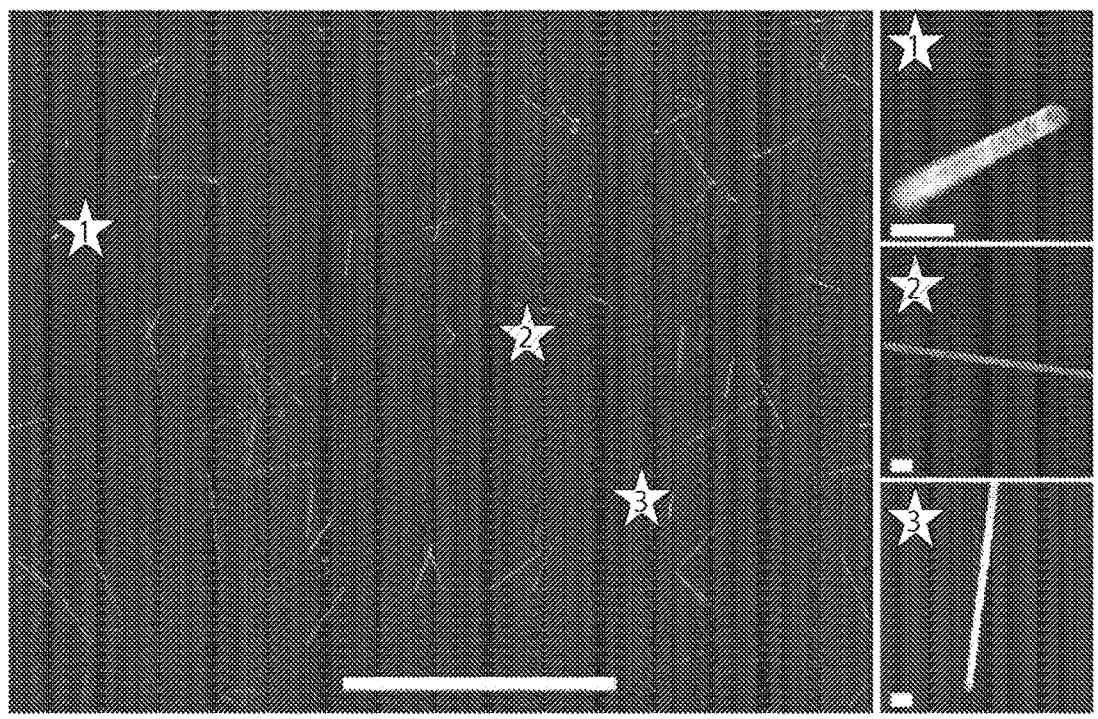
FIGS. 6A-6B illustrate various diameter-modulated nanoscale wires, in some embodiments of the invention.
Figure 6B:
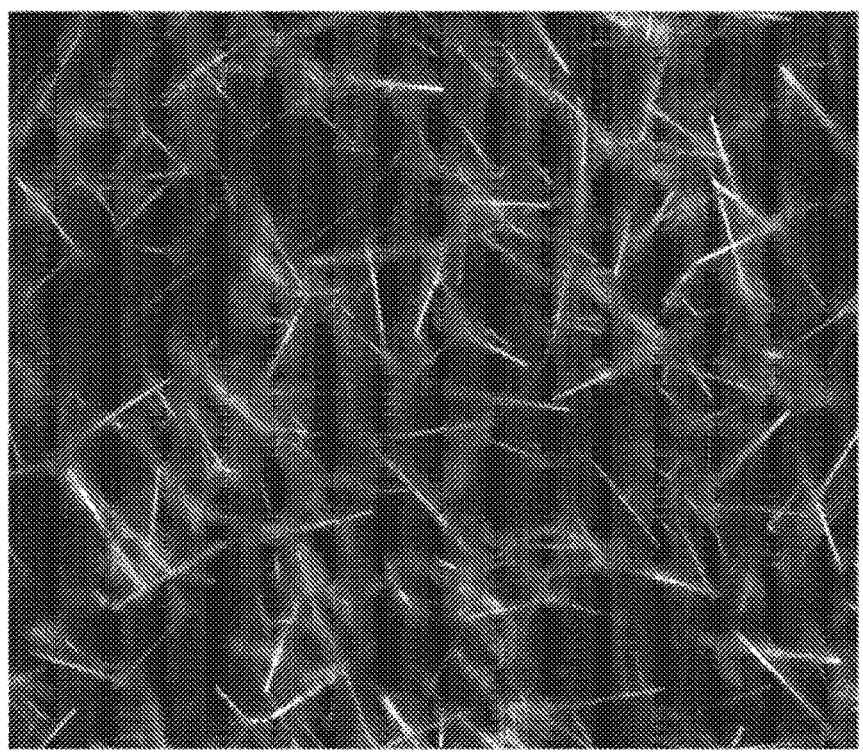

FIG. 6 shows yield of diameter-modulated NWs. FIG. 6A shows, left, SEM image of an approximately 300×250 micrometer$^2$ area from a PS NW growth substrate. Higher-magnification SEM images of NWs denoted by stars are shown on the right. Scale bar, 10 micrometers. Right, high resolution SEM images of the single NWs denoted in the wide area image to the left. Stars 1 and 3 indicate representative images of NWs that clearly have diameter modulations; Star 2 indicates a NW without clear diameter modulation from SEM imaging. Examining all of the NWs in the large area region indicates that the yield of diameter-modulated NWs is ~90%. Scale bars, 1 micrometers. FIG. 6B shows optical dark field image of a PS NW growth substrate. The image was recorded using a 20× objective and an extra 1.6× magnifying lens; subsequently, the color tone of the entire image was adjusted in Adobe Photoshop to reduce the background in order to provide the best contrast for the diameter-modulation of the NWs to be visible.

Figure 1D:
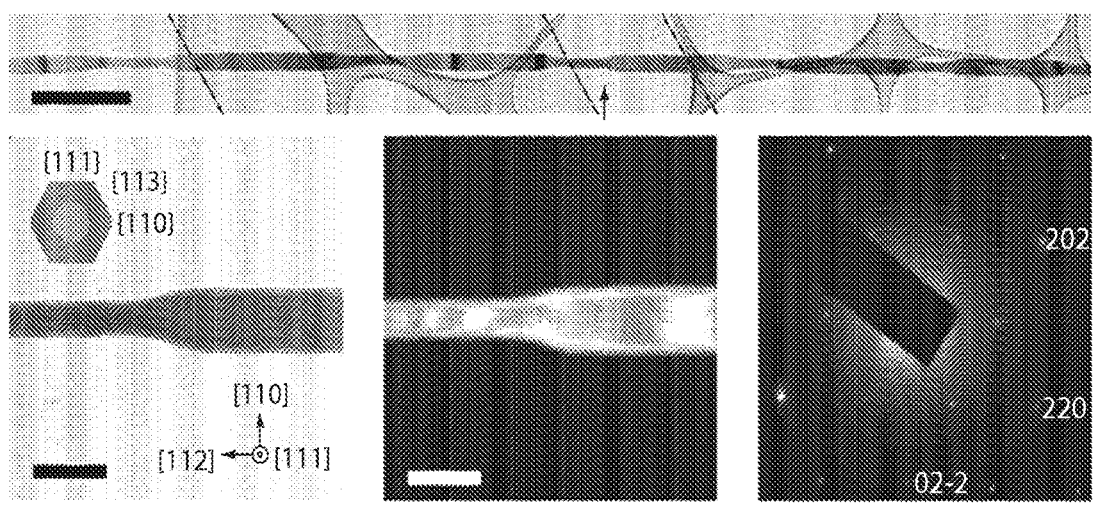

The PSs were characterized according to their material composition, crystalline quality, and axial uniformity. A low-magnification TEM image (FIG. 1D) showed a PS NW from a synthesis that yields low (~1) aspect ratios with pitch ~2 micrometers. Close inspection of the interface between one inner and outer shell by bright field (FIG. 1D, left) and dark field (FIG. 1D, middle) imaging did not indicate any appreciable defects. Electron diffraction obtained from various positions along the nanowire axis (i.e. at the inner shell; outer shell; and the interface between an inner and outer shell) produced indistinguishable diffraction patterns with a single set of spots in the [111] zone axis (FIG. 1D, right) that indicated a [211] nanowire growth axis. Elemental mapping by EDS and EELS at various axial positions failed to reveal the presence of any appreciable impurities, suggesting that the nanowire composition was uniform along its axis. Taken together, TEM imaging, electron diffraction, and compositional analyses demonstrated that PS NWs were highly-crystalline materials with clean core/shell interfaces and were axially-uniform with respect to crystallographic features and material composition.

FIG. 1 shows PR crystal growth of PS NWs with tunable morphology. FIG. 1A is a schematic illustrating PR instability, conformal shell growth, and PR Crystal Growth of periodic shells on NW cores at elevated temperatures. Inset: definition of synthetically tunable morphological features: (1) modulation amplitude—ratio of outer shell diameter, $D_{outer}$, to inner shell diameter, $D_{inner}$, (2) aspect ratio—ratio of outer shell diameter, $D_{outer}$, to outer shell height, $H_{outer}$ and; (3) pitch—sum of a single outer shell length, $L_{outer}$, and a single inner shell length, $L_{inner}$. FIG. 1B, left, is an SEM image of Si particles obtained after annealing 100 nm Si NW cores in vacuum at 900° C. for 3 minutes. Scale bar, 2 micrometers. Right, end-on SEM image of a typical diameter-modulated core/shell NW. Scale bar, 1 micrometer. FIG. 1C is a plan view SEM images showing tunability of pitch for shells deposited on 100 nm NW cores. The different pitches were obtained from distinct syntheses where shell growth temperature and/or $SiH_4$ flow rates were changed. Scale bars, 1 micrometer. FIG. 1D shows crystallographic characterization of PS NWs. Top, composite bright-field TEM image of a low (~1) aspect ratio Si PS NW with average pitch of ~2.2 micrometer. The image shows four individual low magnification images stitched together; image borders are indicated by dashed lines. Scale bar, 1 micrometer. Bottom left and middle, bright and dark field TEM images from the area indicated by the arrow. Scale bars, 400 nm. The dark field TEM image was recorded in the [220] zone axis. Inset, schematic depicting the cross-sectional geometry and surface facet assignments of the PS RWs with AR ~1. Bottom right, electron diffraction patterns in the [111] zone axis from the region shown to the left.

EXAMPLE 2

To better understand the mechanism of PS growth, this example illustrates a series of growth studies where the core size and synthesis were kept constant but shell deposition conditions were systematically changed. Specifically, Si shells were deposited on 100 nm NW cores for different times, temperatures and $SiH_4$ flow rates. Plan view SEM imaging was employed to determine the average pitch for a given synthesis after transferring the as-grown PSs onto $Si_3N_4$-coated Si substrates. SEM images of PSs grown on 100 nm cores for t=0, 6, and 8 minutes (FIG. 7A) at 800° C. with $SiH_4$ flow rate of 0.8 sccm illustrated the spontaneous development of a diameter-modulated shell from a uniform diameter core NW and that the pitch did not change with time. FIG. 7A shows a time-sequence of PS growth. SEM images of NWs obtained from distinct syntheses for which Si shells were deposited onto 100 nm cores (at 800° C. with $SiH_4$ flow rate=0.8 sccm) for times of 0 (left), 6 (middle), and 8 (right) minutes. Scale bars, 1 micrometer.

Figure 2A:
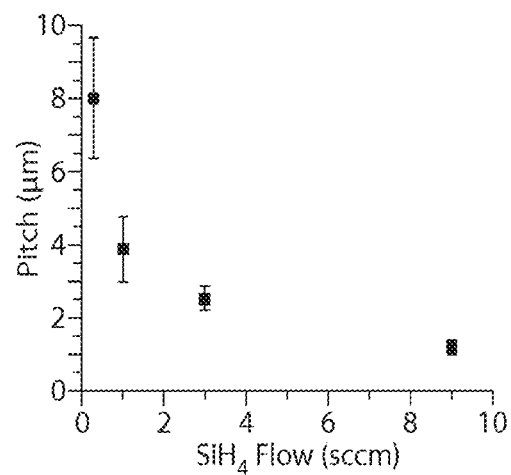
FIGS. 2A-2D illustrate control of Plateau-Raleigh crystal growth, according to some embodiments of the invention.
Figure 2B:
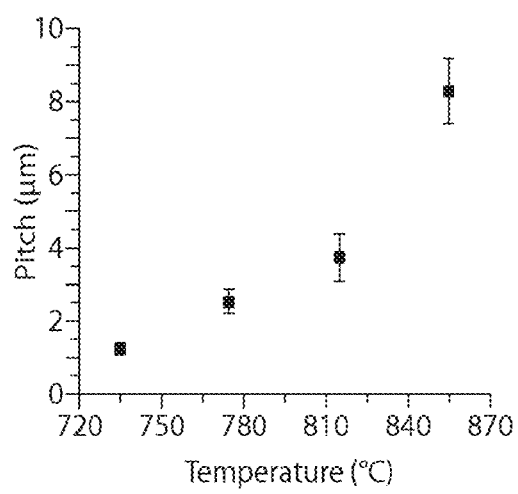

In a second set of experiments, different $SiH_4$ flow rates were used for four separate syntheses (FIG. 2A) for a shell deposition temperature of 775° C.; plan-view SEM images (FIG. 8) revealed that $SiH_4$ flow rates of 9, 3, 1, and 0.3 sccm yield average pitches of 1.2 micrometers, 2.5 micrometers, 3.9 micrometers, and 8.0 micrometers. For a third set of experiments, different shell growth temperatures for a given flow rate of $SiH_4$ (3 sccm) were used for shell growth (FIG. 2B). Deposition at 735° C., 775° C., 815° C., and 855° C. yielded average pitches of 1.2 micrometers, 2.5 micrometers, 3.7 micrometers, and 8.3 micrometers, respectively, as revealed by multiple pitch measurements from plan-view SEM images (FIG. 9). At temperatures lower than 700° C., the shells were not cleanly faceted; at temperatures greater than 900° C., the 100 nm cores underwent a transformation into particles within 3 minutes due to PR instability (FIG. 1B, left). From these systematic growth studies, it can be concluded that, first, the pitch did not change with total growth time, and that second, longer pitches were obtained with higher temperatures (lower $SiH_4$ flow rates) for a given $SiH_4$ flow rate (temperature).

FIG. 2 shows experimental synthetic control and model for PR Crystal Growth. FIG. 2A shows the dependence of pitch on $SiH_4$ flow rate. Si shells were deposited on 100 nm Si cores at 775° C. for various $SiH_4$ flow rates. Error bars denote 1 standard deviation from the average of at least 10 NWs. FIG. 2B shows the dependence of pitch on temperature. Si shells were deposited on 100 nm Si cores with a $SiH_4$ flow rate of 3 sccm. Error bars denote 1 standard deviation from the average of at least 10 NWs. FIG. 8 shows pitch as a function of $SiH_4$ flow rate, including plan view SEM images of PSs grown at ~0.2 torr total pressure and 775° C. with (FIG. 8A) 0.3, (FIG. 8B) 1, (FIG. 8C) 3, and (FIG. 8D) 9 sccm $SiH_4$. Scale bars, 1 micrometer. FIG. 9 shows pitch as a function of temperature, including plan view SEM images of PSs grown at ~0.2 torr total pressure with 3 sccm $SiH_4$ at (FIG. 9A) 735, (FIG. 9B) 775, (FIG. 9C) 815, and (FIG. 9D) 855° C. Scale bars, 2 micrometers.

EXAMPLE 3

Based on the characterization and systematic growth studies, as well as the substantial theoretical framework of PR instability, this example presents a basic model for PR Crystal Growth. However, it should be understood that this example is for explanatory purposes only, and that the invention as claimed should not be limited to the model provided in this example.

As the driving force for PR instability is a thermodynamic reduction in surface energy for a fixed amount of volume it is proposed, first, that the surface energy of a PS NW is lower than the surface energy of a straight NW with equivalent volume and, second, that NWs with longer pitches have less surface energy than NWs with shorter pitches and equivalent volume. It is further proposed that these longer pitch (i.e. lower surface energy) configurations have higher activation barriers to formation than those with shorter pitches and that the reaction kinetics determine whether these lower energy configurations are able to form, specifically by enabling longer Si adatom diffusion lengths.

The experimental results described above are consistent with this model. First, the structural characterization suggests that PS NWs are high quality materials without detectable defects or impurities that could lead to periodic nucleation. Second, growth studies indicate that pitch did not change with time; thus, the initial shell deposition conditions affect the kinetics of the growth process. Third, for the growth of thin films in general, including Si films, higher temperatures and lower precursor fluxes may be directly correlated with longer surface diffusion lengths, and consequently, lower energy film configurations. As shown in FIGS. 2A and 2B, higher temperatures and lower flow rates of SiH$_4$ for shell deposition yielded longer pitches. Fourth, H$_2$ pressure may significantly reduce the surface diffusion length of Si adatoms; no PS NWs were observed through the deposition of Si at high (>25 torr) H$_2$ pressures. Comparable Si shell growth rates at higher H$_2$ pressures of 25 torr for the same temperature and gas flow rates did not yield PS structures, suggesting that H$_2$ itself plays a direct role in kinetic product formation by reducing Si adatom surface diffusion lengths. To further test this, separate syntheses were performed during which PH$_3$ and B$_2$H$_6$ gases were introduced, which are known to reduce Si adatom surface diffusion lengths, at various flow rates during shell growth.

Introduction of these gases at low flow rates reduced the pitch compared to standard PR Crystal Growth; at higher flow rates, diameter-modulated NWs were not observed. These impurities may reduce Si adatom surface diffusion lengths and thus, kinetically trap shell growth at shorter pitches. PR Crystal Growth may lead to spontaneous growth of periodic shells and that a structural rearrangement (i.e. PR instability) of the shell does not occur. Annealing 100 nm diameter cores at 775° C. for 2 hours, which is significantly longer than typical PS growth times of <10 minutes, did not lead to significant structural changes to the core, confirming that PR instability itself is not occurring at timescales relevant for most PS growths.

Figure 10:
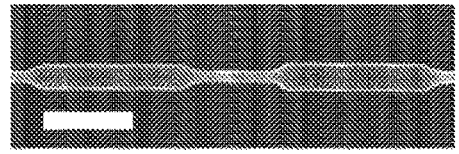
FIG. 10 is an SEM of a typical nanoscale wire in accordance with one embodiment of the invention.

In addition to experimental support for this model, a straightforward geometric analysis that addresses the thermodynamic aspect of this model is as follows. For a solid, the total surface energy can be represented as:

$$\gamma_{Total} = \sum_i \gamma_i A_i \quad (1)$$

where $\gamma_{Total}$ (gamma$_{Total}$) is the total surface energy of the solid, $\gamma_i$ (gamma$_i$) is the surface energy of facet i, and $A_i$ is the area of surface i. To a first approximation, the relative surface energies of different 1D structures can be reasonably approximated with their total SAs, assuming an energetically isotropic solid (see below). The surface areas of various structures can be compared, all of which have equivalent volumes. First, the volume of a PS with inner and outer shell diameters of 100 and 300 nm with a pitch of 3 µm can be calculated (with input dimensions obtained from the SEM image in FIG. 10); a non-modulated NW with diameter of ~224 nm has equivalent volume to this PS. FIG. 10 shows geometrical input for calculations, including an SEM image of a typical NW whose dimensions were used as inputs for the geometric simulations in FIGS. 2C and 2D. Scale bar, 1 micrometer. For this specific case, the diameter-modulated NW has 0.98 SA of the straight NW (SA$_{straight}$). Next, the surface areas of PS NWs are plotted with this same, constant volume and fixed a pitch of 3 micrometers but with different modulation amplitudes (FIG. 2C); the dotted line indicates the surface area of the non-modulated (i.e., straight) NW with a diameter of 224 nm. There is a clear range of modulation amplitudes for which a PS has less SA than its volume-equivalent straight NW with a minimum value of 0.91 SA$_{straight}$ for a modulation amplitude of ~4.2.

Figure 11A:
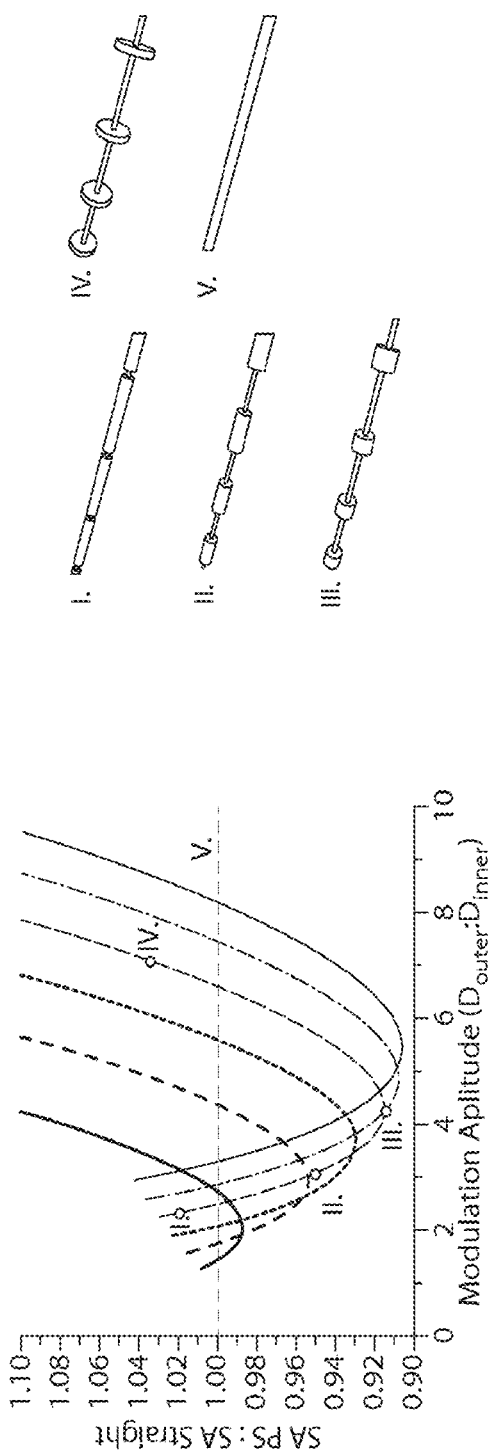
FIGS. 11A-11B illustrate surface area ratios in accordance with some embodiments of the invention.
Figure 11B:
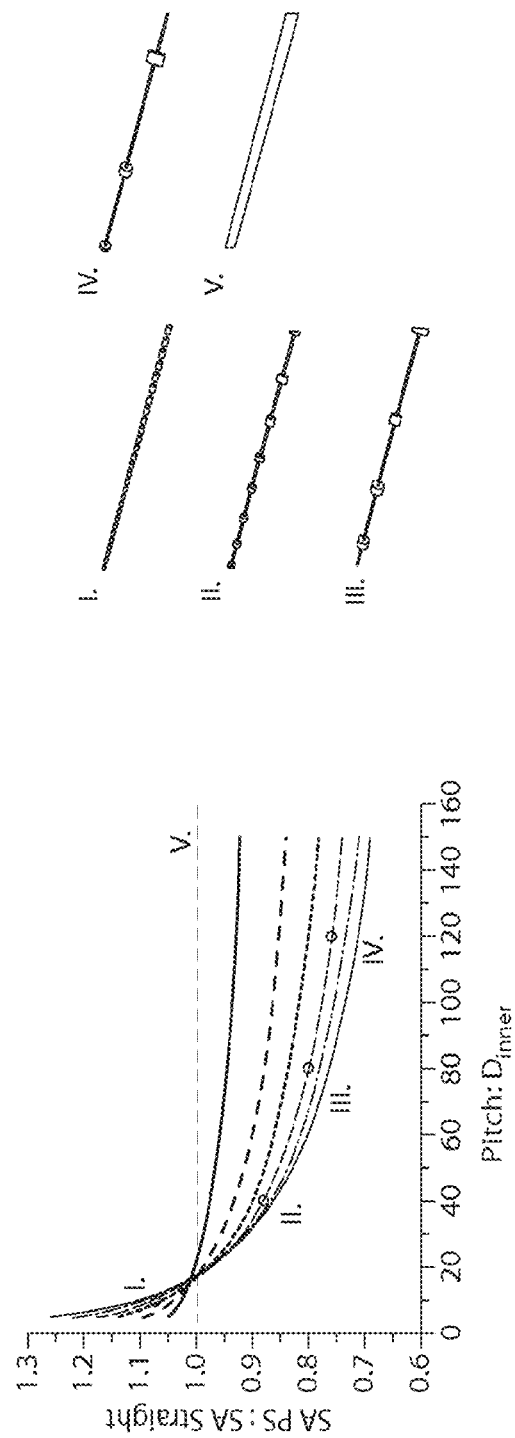

The SA of PSs of equivalent volume but with different pitches (FIG. 2D) could also be calculated. From this, it was observed that as pitch increases, the SA decreases. Similar calculations were performed using various fixed total shell volumes for fixed pitch (FIG. 11A) and for variable pitch (FIG. 11B); while the minimum SA configuration changes for different shell volumes, the overall trend remains unchanged. FIG. 11 shows surface area ratio comparisons with different shell volumes. FIG. 11A, left, the SA PS NW: SA straight NW ratio as a function of modulation amplitude for different shell volumes added to a 100 nm core. Right, to-scale 3D PS NW models corresponding to points (I-IV) indicated on the curve for a given V$_{added}$ and pitch as well as the equivalent volume straight NW (V). FIG. 11B, left, the minimum SA PS NW: SA straight NW ratio as a function of pitch for different shell volumes added to a 100 nm core. Right, to-scale 3D PS NW models corresponding to the various geometries, all with constant V$_{added}$ but variable pitch, for which the minimum SA for a given V$_{added}$ was calculated along the curve (I-IV) and the equivalent volume straight NW (V). For both plots, the volumes added to the PS NWs and the straight NWs are equivalent for each curve. Input geometries were derived from PS NWs with L$_{inner}$=1500 nm, L$_{outer}$=1500 nm, D$_{inner}$=100 nm, and variable D$_{outer}$=150, 200, 250, 300, 350, and 400 nm (in order from left to right in FIG. 11A, left, and top to bottom, FIG. 11B, right). For reference, the curves are the same as those shown in FIGS. 3E and 3F. Left/bottom axes, general dimensions rewritten as dimensionless ratios. Absolute SA values, as shown in the top and right axes in FIGS. 3E and F, are different for each plot trace, and thus axes with specific NW dimensions were excluded from this multi-trace plot.

Figure 2C:
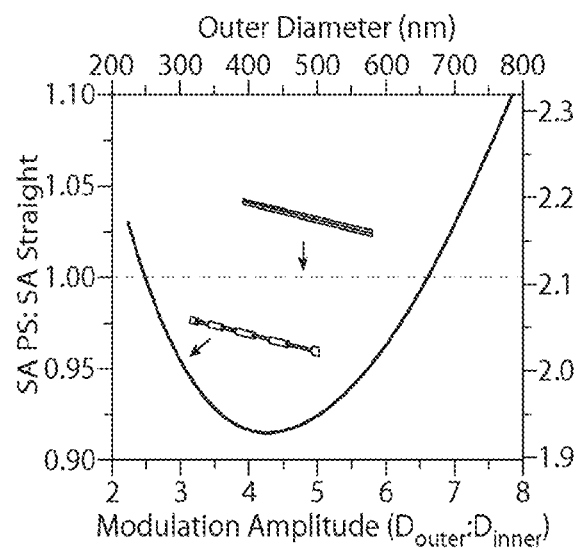
Figure 2D:
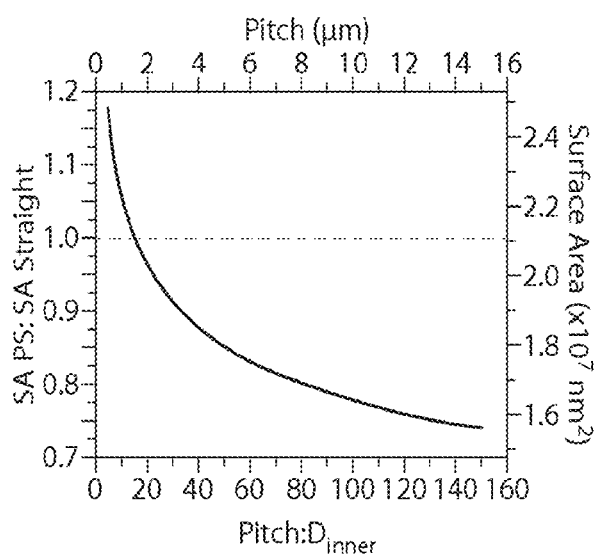

FIG. 2C shows surface area (SA) comparisons for constant pitch. The SAs of PS NWs with various modulation amplitudes are compared to a straight NW with equivalent volume. All structures have equivalent volume and a pitch of 3 micrometers. Right/top axes, absolute values from the calculations assuming total NW length of 30 micrometers and inner diameter of 100 nm. Left/bottom axes, calculated results rewritten as dimensionless ratios. The SA of a straight NW with equivalent volume is denoted by the dashed line. All structures have the same total volume. FIG. 2D shows SA comparisons for variable pitch. The SAs of PS NWs with various pitches are compared to a straight NW with equivalent volume. All structures have equivalent volume and the lowest possible SA configuration for a given pitch. Right/top axes, absolute output values from the calculations assuming total NW length of 30 micrometers and inner diameter of 100 nm. Left/bottom axes, general dimensions rewritten as dimensionless ratios. The SA of a straight NW with equivalent volume is denoted by the dashed line.

In summary, this geometric analysis supports the thermodynamic aspect of this model and provides a plausible pathway for surface energy reductions, namely through SA reductions: PSs can have less SA compared to uniform diameter NWs and NWs with longer pitches can have less SA than NWs with shorter pitches. Given the energetic anisotropy of Si surfaces, it is noted that further SE reductions (and deviations from this model) likely occur via a relative expansion in SA of lower energy facets at the expense of higher energy facets. Furthermore, it is noted that this model and geometric calculations do not make assumptions about the material composition or absolute sizes.

EXAMPLE 4

To test the validity of this model and to determine the scope and generality of PR Crystal Growth, shells were deposited onto NW cores of different diameters and material compositions. Similar to the growths on 100 nm cores described previously, 30 nm diameter Si NW cores were grown by the VLS process in a CVD followed by introduction of SiH$_4$ at low pressures for shell growth. SEM images (FIG. 3A) of transferred core/shell NWs from this synthesis revealed a diameter-modulated PS NW structure. PS growth on these 30 nm cores yielded a high observed modulation amplitude of ~8 with outer shell diameter ~230 nm, inner shell diameter ~30 nm, and pitch of ~600 nm; such a high modulation amplitude of diameter-modulated NWs has not been achieved previously through synthetic means.

Moreover, these thinner PS NWs allow for higher resolution characterization compared to the much larger PS NWs shown in FIG. 1. A high-resolution, lattice resolved TEM image (FIG. 3B) obtained at the junction between one inner and outer shell shows continuous lattice fringes over the entire structure with no indications of defects or an interface between the core and shell. Electron diffraction from this area (FIG. 3B, lower inset) again yielded a single set of spots in the [111] zone axis, confirming the highly crystalline and defect-free nature of the small PS NWs. Si deposition on Si NW cores of 50 and 80 nm diameters at similar PS growth conditions also yielded diameter-modulated NWs.

In addition to Si materials, the growth of Ge PS NWs was also explored. Notably, the introduction of GeH$_4$ at sufficiently low pressures and high temperatures onto uniform-diameter Ge cores with diameters of 50 nm yielded diameter-modulated PS NWs (FIG. 3C). From these growths, it appears that PR Crystal Growth is possible with cores of different diameters and material compositions. This generality is consistent with the thermodynamic understanding of the above model, where surface energy minimization can occur with periodic crystals growing on any 1D material.

FIG. 3 shows the generality and scope of PR Crystal Growth in this example. FIG. 3A shows SEM images of Si PSs on Si core NWs with diameters of 30 nm. Scale bars, 1 micrometer. FIG. 3B shows an HRTEM image of the transition from inner to outer shell of a Si PS grown on a 30 nm core NW. Scale bar, 10 nm. Inset, electron diffraction pattern in the [111] zone axis. FIG. 3C shows an SEM image of Ge PSs deposited on a Ge core NW with a diameter of 50 nm. Scale bar, 1 micrometer.

EXAMPLE 5

This example demonstrates the potential for controlling cross-sectional aspect ratio through changes in shell growth conditions. SEM images revealed that the deposition of Si onto NW cores at very low flow rates of SiH$_4$ generated high (~4:1) aspect ratio structures (FIG. 3D) compared to the low (~1) aspect ratio observed at higher SiH$_4$ flow rates such as the one shown in FIG. 1B, right. In particular, FIG. 3D shows a head-on SEM image of a high (~4:1) aspect ratio Si PS NW grown with low flow rates of SiH$_4$. Scale bar, 400 nm.

TEM images and diffraction of high aspect ratio structures grown on 100 nm Si cores showed similar material quality as well as the same growth directions as the Si NWs from FIG. 1, indicating that the aspect ratio was controlled by shell deposition conditions and did not result from differences in the underlying core (e.g. growth direction). It is proposed that the inherent anisotropies of crystal surfaces combined with the kinetics of surface diffusion allowed this synthetic tunability of aspect ratio. For a given Si surface, the ratio of surface diffusion coefficients of Si adatoms in different crystalline directions can be as high as 1000:1. Moreover, mass transport from one facet to another may occur for small Si facet lengths. The dependence of these diffusional anisotropies on deposition conditions as well as the different relative lengths and energy densities of different surfaces may lead to formation of the different aspect ratios. The PR Crystal Growth model can serve as a foundation for creating even more complex morphologies.

EXAMPLE 6

Given the broad range of morphologies accessible through PR Crystal Growth, this example investigated the optical properties of various PS NW structures. Dark field optical images (FIG. 4A) of two PS NWs indicate that distinct wavelengths were scattered efficiently at different points along the axes of the NWs. SEM images of the NW in FIG. 4A, left, revealed that the structure has outer and inner diameters of ~250 nm and ~205 nm, respectively, indicating that the modulation of scattered light correlates with the modulation of the NW diameter. The optical properties of uniform-diameter Si NWs may be significantly influenced by their diameters and cross-sectional morphologies.

Figure 4A:
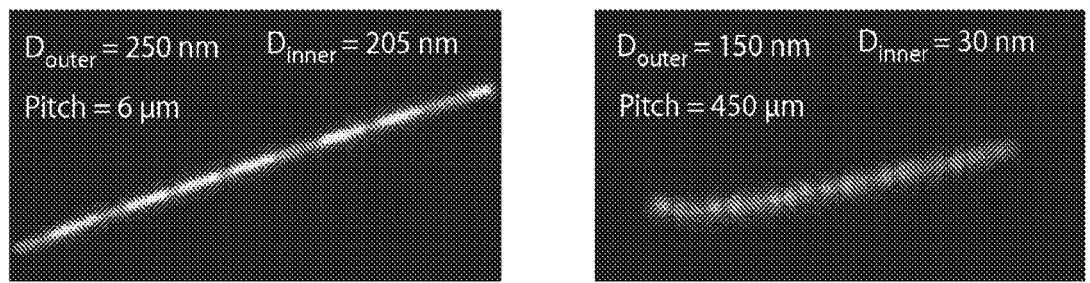
FIGS. 4A-4C illustrate optical properties of certain nanoscale wires, in certain embodiments of the invention.
Figure 4B:
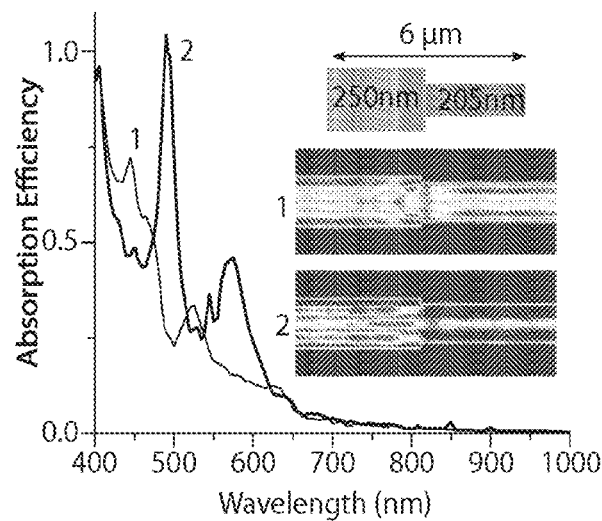

The absorption properties of PS NWs was simulated using finite-difference time-domain (FDTD) light absorption simulations (FIG. 4B). The dimensions for the NW shown in FIG. 4A, left, were used to define the simulation geometry. Absorption spectra for the inner and outer shells revealed that distinct absorption of light could occur along the axis of the NW. Distinct optical resonant absorption mode profiles (FIG. 4B, inset) illustrate the localization of light absorption in the inner vs. outer shell for wavelengths noted by 1 (455 nm) and 2 (490 nm), respectively. The optical resonant mode at 530 nm was confined primarily to the outer shell, which leads to ~3-fold higher absorption compared to the inner shell.

Figure 4C:
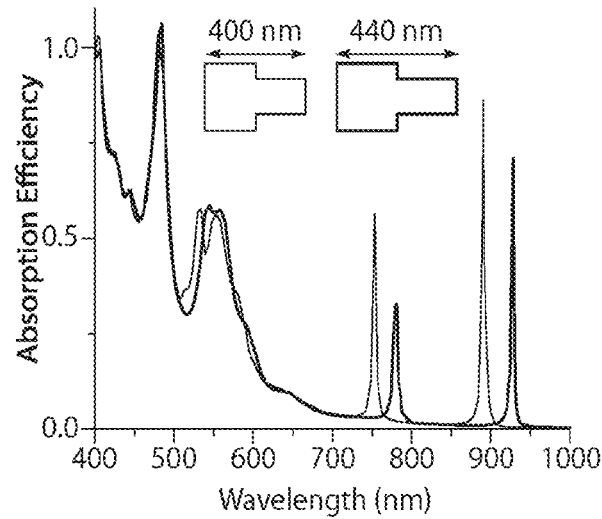

FIG. 4 shows optical properties of Si PS NWs. FIG. 4A, left and right, Dark field optical images of PS NWs with different dimensions as determined from SEM measurements. Inner and outer diameters of the NW in the left image were used as input dimensions for absorption simulations in FIGS. 4B and 4C. FIG. 4B shows light absorption of inner vs. outer shell. FDTD simulations of transverse-electric light absorption in a Si PS NW with the same dimensions as the NW from FIG. 4A with a 6 micrometer pitch. Spectra were obtained from finite-volume slices at the center of the outer and inner shells. Inset, absorption mode profiles at wavelengths of 445 nm (top) and 490 nm (bottom) denoted by 1 and 2.

EXAMPLE 7

This example explores how the absorption properties of diameter-modulated NWs may change as a function of pitch. FDTD light absorption simulations (FIG. 4C) were performed for a NW whose inner and outer diameters were same as for FIG. 4B, but with shorter pitches. The total (i.e. inner and outer shell) absorption spectra for NWs with pitches of 440 nm and 400 nm reveal high-amplitude peaks at longer wavelengths. FIG. 4C shows light absorption of PS NWs with small pitches. FDTD simulations of total light absorption in Si PS NWs with pitches of 400 and 440 nm. Inner and outer shell diameters are the same as in FIG. 4B. Analysis of the mode profiles (FIG. 12) for these wavelengths indicate that they were grating modes and that the peak position for a given mode red shifted as pitch increases. Taken together, the dark field optical images and absorption simulations revealed that the optical properties are tunable through controlled PR Crystal Growth.

Figure 12A:
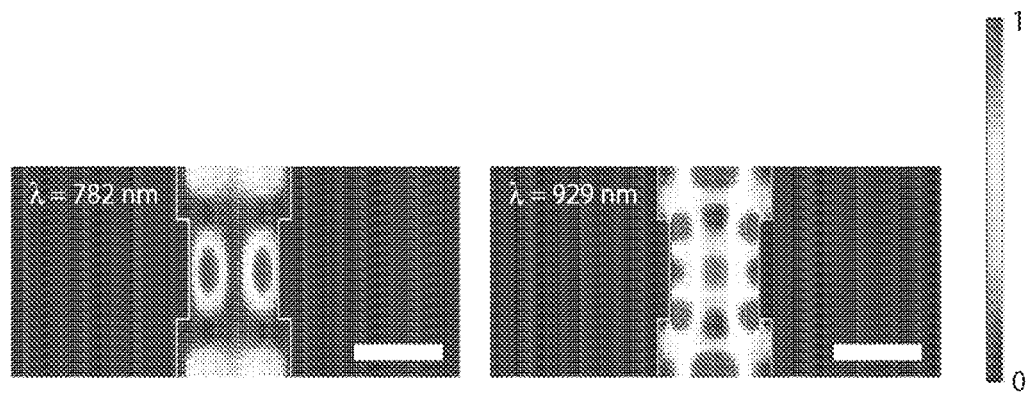
FIGS. 12A-12B illustrate absorption on certain nanoscale wires, in some embodiments of the invention.
Figure 12B:
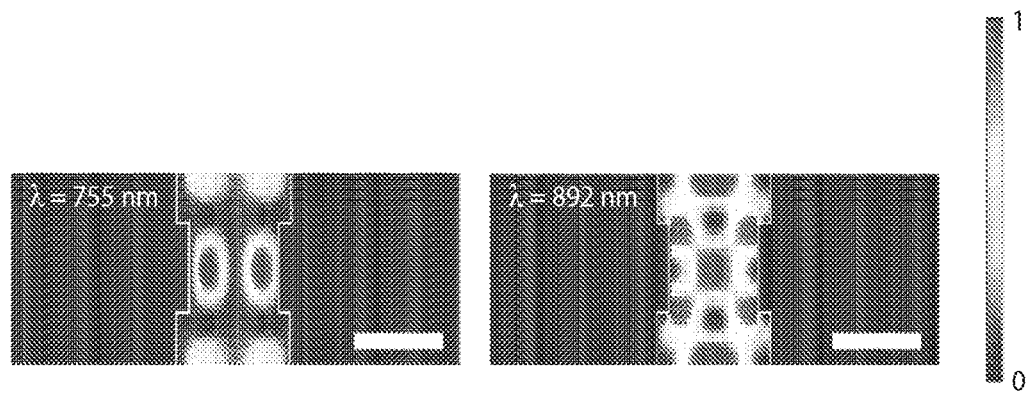

FIG. 12 shows grating mode profiles. FIG. 12A shows absorption mode profiles corresponding to peaks in FIG. 4C. Profiles are from 782 nm (left) and 929 nm (right) for a PS NW with outer diameter of 250 nm, inner diameter of 205 nm, and pitch of ~440 nm. Scale bars, 200 nm. FIG. 12B shows absorption mode profiles at 755 nm (left) and 892 nm (right) for a PS NW with outer diameter of 250 nm, inner diameter of 205 nm and pitch of 400 nm. Scale bars, 200 nm.

The following discussion gives perspective on PR Crystal growth compared to other synthetic techniques and clarifies the relationship to and distinctions from traditional PR instability. Thermodynamically, for PR instability, any sinusoidal surface perturbation (i.e. diameter-modulation) that develops along the axis of the cylinder with a characteristic wavelength greater than the circumference of the original cylinder will lower the surface energy and thus will grow in time. However, it has been proposed that the resultant spacing of 0D particles is determined by the kinetics; the fastest growing perturbation is ~4.5 times the diameter of the cylinder, which eventually pinches off from the cylinder, preventing subsequent mass transfer and the attainment of lower energy configurations with longer pitches. Unlike PR instability where the source of mass transfer comes from the original 1D material itself, the source for PR Crystal Growth is provided externally from decomposition of a reactant (e.g. $SiH_4$ or $GeH_4$); thus, the kinetics of adatom diffusion, nucleation and growth along the axis of the NW can be controlled, for example, by increasing temperature without rearranging the underlying core and without the irreversible pinch off that can prevent subsequent mass transfer as it does for cases of constant-volume transformations (i.e. PR of NW cores, or PR of heterostructured shells on cores).

In summary, PR Crystal Growth is general to 1D materials as this model suggests, and with experimental demonstration on Si and Ge cores of different diameters. As various material properties (e.g. thermal, electrical, mechanical) of NWs depend on the NW diameter, cross-sectional morphology, and composition, PR Crystal Growth has may allow for novel functionality in NW devices for a variety of applications.

EXAMPLE 8

The following are various materials and methods used in the above examples. Si core NWs were synthesized as described previously via the Au-catalyzed VLS mechanism. See, e.g., U.S. Pat. No. 7,211,464; 7,301,199; 7,476,596; 7,595,260; 7,666,708; 7,915,151; or 8,153,470, each incorporated herein by reference. Following core growth, the furnace temperature was ramped to 700 to 850° C. for PS growth. At this temperature, shells were grown for 1-60 minutes at ~0.2 torr with gas flow rates of 0.15-10 sccm $SiH_4$ and 0-200 sccm $H_2$. For some syntheses, diborane ($B_2H_6$, 100 p.p.m. in $H_2$) or phosphine ($PH_3$, 1000 p.p.m. in $H_2$) was introduced to the reactor during shell growth at 0.5-20 sccm flow rates. Germanium core NWs were typically synthesized from 50 nm Au catalysts at a total pressure of 300 torr with 200 sccm $H_2$ and 20 sccm germane ($GeH_4$; 10% in $H_2$) flow rates. Ge cores were nucleated for 5 minutes at 330° C. and grown for another 50 minutes at 270° C. To grow Ge PSs, the temperature was increased to 450° C. and the pressure decreased to ~0.2 torr with 10% $GeH_4$ flow rates of 30 sccm.

End-on view SEM images of PS NWs were recorded directly from the as-synthesized growth wafers. For plan view SEM images and NW pitch measurements, NWs were transferred to $Si_3N_4$-coated Si wafers. For TEM, STEM, and diffraction analysis, NWs were transferred to an amorphous carbon-coated copper TEM grid. EDS peaks were assigned by the PeakID algorithm in the EDAX Genesis software and confirmed by checking standard references (EDAX). EELS data were collected by fixing the converged electron beam at various points along the NW and spatially separating the transmitted electrons using an energy filter in the STEM column. Energy loss vs. position on the CCD was calibrated using the zero-loss peak. Spectra were collected and added 1000 times each.

Optical dark field images were recorded of NWs which were transferred to silicon nitride-coated substrates. FDTD calculations assumed plane waves with either transverse-electric (TE) or transverse-magnetic (TM) polarization states were vertically incident on single NWs on 200 nm thick $Si_3N_4$/100 nm thick $SiO_2$ substrates. The absorption cross section of a NW was calculated by integrating J·E at each grid point over one optical period, where J and E are the polarization current density and electric field, respectively. For a PS NW with a finite pitch size, the NW was divided into small segments with lengths of 200 nm along the NW axis and calculated the absorption cross section at each segment (FIG. 4B). In the PS NW simulations, calculations were performed with a spatial resolution of $10/\sqrt{3}$, 10, and 10 nm for each axis and a calculation domain size of $1.6/\sqrt{3} \times 6 \times 0.9$ micrometers$^3$.

Surface areas of PS NWs were calculated by constructing a unit cell comprising adjoining cylinders of lengths $L_{inner}$ and $L_{outer}$ and diameters $D_{inner}$ and $D_{outer}$; one inner and one outer cylinder define a unit cell (FIG. 13A). FIG. 13A shows a schematic of the unit cell used in the surface area calculation model. For geometric SA calculations, a unit cell of a PS NW was approximated as two adjacent cylinders of lengths $L_{inner}$ and $L_{outer}$ and diameters $D_{inner}$ and $D_{outer}$. It was assumed that the additional volume added, $V_{added}$, to the system was contained within the outer shell. The geometry was systematically varied (either modulation amplitude as in FIG. 3D or pitch as in FIG. 3D) to calculate the lowest surface area configuration. Considerations of multiple $V_{added}$s are found in FIG. 11.

Periodic Shell Nanowire (PS NW) Synthesis. Si PS NW growth: Au catalysts (30, 50, 80, and 100 nm; BBI International via Ted Pella) were dispersed on an oxidized Si wafer functionalized with 10% poly-L-lysine (Sigma Aldrich). After rinsing in DI water and drying with nitrogen, the substrates were placed into a home-built chemical vapor deposition reactor and the system was evacuated to a base pressure of ~5 mTorr. Si cores were grown via the Au-catalyzed VLS mechanism for ~10-60 minutes at 465° C. and a total pressure of 40 torr with 1 sccm silane ($SiH_4$; 100%) and 60 sccm hydrogen ($H_2$) flow rates. Following core growth, the furnace temperature was ramped to 700-850° C. for shell growth. At this temperature, shells were grown for 1-60 minutes at ~0.2 torr with gas flow rates of 0.15-10 sccm $SiH_4$ and 0-200 sccm $H_2$. For some syntheses, diborane ($B_2H_6$, 100 p.p.m. in $H_2$) or phosphine ($PH_3$, 1000 p.p.m. in $H_2$) were introduced to the reactor during shell growth at 0.5-20 sccm flow rates.

Ge PS NW growth: Germanium core NWs were typically synthesized from 50 nm Au catalysts at a total pressure of 300 torr with 200 sccm $H_2$ and 20 sccm germane ($GeH_4$; 10% in $H_2$) flow rates. Ge cores were nucleated for 5 minutes at 330° C. and grown for another 50 minutes at 270° C. To grow Ge PSs, the temperature was increased to 450° C. and the pressure decreased to ~0.2 torr with 10% $GeH_4$ flow rates of 30 sccm.

NW Characterization. End-on view scanning electron microscope (SEM, Zeiss Ultra Plus field emission SEM) images of PS NWs were recorded directly from the as-synthesized growth wafers. For plan view SEM images and NW pitch measurements, NWs were transferred to $Si_3N_4$-coated Si wafers. For transmission electron microscope (TEM) and diffraction analysis, NWs were shear transferred to an amorphous carbon-coated copper TEM grid and imaged directly in JEOL 2100 or JEOL 2010F field emission high resolution TEMs operating at 200 keV. Scanning TEM (STEM) imaging and analysis was performed on an energy filtered $C_s$-STEM Aberration Corrected Zeiss Libra 200 MC operating at 200 keV equipped with pre- and post-filter high-angle annular dark-field (HAADF) detectors, dual x-ray detectors for energy dispersive x-ray spectroscopy (EDS), and drift correction. The system was tuned to 18 mrad information transfer with a beam spot size less than 2 nm. EDS spectra were collected by fixing the converged electron beam at various points along the NW for 5 minutes and recording the resultant x-rays with 400 microsecond dwell time and 102.4 microsecond amp time. EDS peaks were assigned by the PeakID algorithm in the EDAX Genesis software and confirmed by checking standard references (EDAX). EDS maps were recorded for ~4 hours in cropped regions of interest at 512×400 resolution, 400 microsecond dwell time per pixel, and 102.4 microsecond amp time. Electron energy loss spectra (EELS) were collected by fixing the converged electron beam at various points along the NW and spatially separating the transmitted electrons (19.50 eV/micrometers) using the energy filter. Energy loss vs. position on the CCD was calibrated using the zero-loss peak. Spectra were collected and added 1000 times each.

Optical dark field images of NWs on silicon nitride-coated substrates were recorded on an Olympus BX51 microscope.

FDTD calculations. Plane waves with either transverse-electric (TE) or transverse-magnetic (TM) polarization states are simulated to be vertically incident to a single NW on 200 nm thick $Si_3N_4$/100 nm thick $SiO_2$ substrate. Periodic boundary conditions and perfectly matched layers were applied along the NW axis and at the other boundaries, respectively. The total-field scattered-field (TFSF) method was applied to project an infinite plane wave to a NW. The Drude-critical points model was used to model the dispersive properties of Si NWs over the wavelength range of 400-800 nm. The absorption cross section of a NW was calculated by integrating J·E at each grid point over one optical period, where J and E are the polarization current density and electric field, respectively. For a PS NW with a finite pitch size, the NW was divided into small segments with lengths of 200 nm along the NW axis and calculated the absorption cross section at each segment (FIG. 4B). In the PS NW simulations, calculations were performed with a spatial resolution of 10/sqrt(3), 10, and 10 nm for each axis and a calculation domain size of 1.6/sqrt(3)×6×0.9 m³.

Surface areas and energies of PS NWs. This analysis compared the surface areas of various 1D configurations, all of which have the same total volume. By approximating the total surface energy of a 1D material with its total surface area and its cross-sectional morphology as cylindrical, it was proposed that PSs could have reduced surface energies compared to uniform diameter NWs of equivalent volume. With this straightforward geometric analysis, the model was material-independent and dimensionless. The assumptions and treatment of the model are discussed below.

Surface area approximation for surface energy. For a solid with energetically anisotropic surfaces, the total surface energy is $$\gamma_{Total} = \sum_i \gamma_i A_i \qquad (1)$$

where $\gamma_{Total}$ is the total surface energy of the solid, $\gamma_i$ is the surface energy density of facet i, and $A_i$ is the area of surface i. To a first approximation, the relative surface energies of different 1D structures can be approximated with their total surface areas (SAs), assuming an energetically isotropic solid. For this approximation to be reasonable, the surface energy densities should not differ significantly. For commonly observed silicon surfaces, experimental measurements have yielded surface energy densities to be within ~15% of each other; specifically the surface energy densities of Si {100}, {110}, {111}, and {113} surfaces are estimated to be 1.36-1.40, 1.43-1.51, 1.23-1.34, and 1.38 $Jm^{-2}$.

In principle, the inclusion of specific surface energy densities and non-circular cross section would more accurately represent these structures. However, doing so would unnecessarily introduce adjustable parameters at present. First, experimental and theoretical techniques yield a range of different surface energy density values. In addition to the disputed surface energy densities, the exact identity and nature (e.g. reconstructed vs. not reconstructed, presence and identity of adsorbates, etc.) of the many facets on the PS NWs are not known. Thus, incorporating either the surface energy density values or specific surface identities to the model would unnecessarily complicate a rather straightforward approach and limit the model's generality for other materials. This geometric approach makes no other specific assumptions about Si and can thus be extended to other 1D materials where the range of surface energy densities for various surfaces are reasonably close.

Surface area comparisons for various structures with fixed volume. The surface areas of various 1D configurations were compared, all of which have the same total volume. For PS growth, the core itself does not change, and so all of the volume is added to the shell. The PS NW was approximated to be formed of adjoining cylinders of lengths $L_{inner}$ and $L_{out}$, and diameters $D_{inner}$ and $D_{outer}$; one inner and one outer cylinder define a unit cell (FIG. 13A). The additional volume added, $V_{added}$, to the system was assumed to be contained within the outer shell and is, thus, expressed as $$V_{added} = V_{outer} - V_{core} = \frac{\pi L_{outer}}{4}(D_{outer}^2 - D_{core}^2) \qquad (2)$$

Furthermore, it was assumed that the diameter of the inner shell as that of the core NW, which is reasonable for short growth times.

Surface area of PS with constant volume and fixed pitch. The surface areas of the following structures were compared, all of which have equivalent $V_{added}$ shell volumes: uniform diameter NWs and various PS NWs with different diameter modulations and assuming the inner shell diameter is constant (see FIG. 11, right for a schematic representation of various configurations for constant $V_{added}$). In FIG. 2C, the specific case in which $V_{added}$ is constant and pitch is fixed at 3 micrometers but modulation amplitude can change was considered. $V_{added}$ was obtained from dimensions of a PS NW measured by SEM (FIG. 10; $L_{inner}$=1,500 nm, $L_{outer}$=1,500 nm, $D_{inner}$=100 nm, $D_{outer}$=300 nm, and total length, $L_{total}$=30 micrometers). For these dimensions, $V_{added}$=9.4×10$^8$ nm$^3$ for the 30 micrometer NW. If this $V_{added}$ were distributed uniformly along the NW axis, the NW would have a uniform diameter along its axis of:

$$D_{straight,equiv} = \left(\frac{4(V_{added} + V_{core})}{\pi(L_{inner} + L_{outer})}\right)^{\frac{1}{3}} \quad (3)$$

In the case of the above geometry, the equivalent diameter for a straight NW would be $D_{straight, equiv}$=~223.6 nm.

Next, the SA of this PS NW was compared to the SA of the straight NW with equivalent volume. The SA of the PS within one unit cell is the sum of the SAs of the inner shell cylinder and the outer shell cylinder (excluding surfaces which are shared at the interface of the two cylinders):

$$SA_{PS} = \pi\left[(D_{inner}L_{inner}) + (L_{outer}D_{outer}) + \left(\frac{1}{2}D_{outer}^2\right) - \left(\frac{1}{2}D_{inner}^2\right)\right] \quad (4)$$

And the SA of the straight NW with equivalent volume is:

$$SA_{straight,equiv} = \pi D_{straight,equiv}(L_{inner}+L_{outer}) \quad (5)$$

For these two configurations, the SA of the PS to the SA of the straight NW is $SA_{PS}/SA_{straight,equiv}$.

Next, the SAs of NWs with different modulation amplitudes was determined by varying $L_{outer}$ (and thus $L_{inner}$, since $L_{outer}+L_{inner}$=pitch=3,000 nm) for 20 nm<$L_{outer}$<3,000 nm in increments of 20 nm. Since $V_{added}$ is constant, $D_{outer}$ must also change with $L_{outer}$. Rearranging equation (2) for $D_{outer}$ yields:

$$D_{outer} = \left(\frac{4V_{added}}{\pi L_{outer}} + D_{inner}^2\right)^{\frac{1}{2}} \quad (6)$$

For every $D_{outer}$, SA was calculated. Absolute SA values can be compared for a given $D_{outer}$ or dimensionless comparisons can be made with ratio of PS SA to Straight NW SA for a given diameter modulation (where diameter modulation=$D_{outer}/D_{inner}$, and $D_{inner}$ is constant here at 100 nm). (See FIG. 11A for additional calculations of SA vs. diameter modulation with different values of $V_{added}$ and to-scale representations of various modulation amplitudes and their corresponding SAs.)

Surface area of PS with constant volume and varying pitch. For the above calculations, $V_{added}$ was constant, the pitch was fixed and SA was calculated as function of modulation amplitude. Given that different pitches were observed experimentally, it is also important to compare how SA changes for a given constant volume if pitch is not a fixed parameter. For consideration of SA vs. pitch (FIG. 2D), the above simulation was expanded by considering pitches ranging from 500 nm to 15 micrometers in increments of 100 nm. For the above calculation, a total NW length of $L_{total}$=30 micrometers was assumed such that there are 10 unit cells per NW for a pitch of 3 micrometers; this allowed absolute surface area comparisons for a length that is comparable to the NWs employed. However, for the general case with different pitches or total lengths, there are n=$L_{total}$/pitch unit cells per NW and the volume was distributed evenly among the n outer shells. For each pitch, the above calculations were performed to produce SA values as a function of diameter modulation. The minimum SA for a given pitch is then plotted as a function of SA vs. pitch. (See FIG. 11B for additional calculations of SA vs. pitch with different values of $V_{added}$ and to-scale schematics of the various pitches, diameter modulations, and SAs.)

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An article, comprising:
a nanowire comprising (a) a continuous core, (b) a plurality of first longitudinal portions that are discontinuous and are substantially regularly longitudinally spaced along the nanowire, the first longitudinal portions comprising a shell material at least partially surrounding the core and having a substantially constant cross-sectional area, and (c) a plurality of second longitudinal portions positioned between the first longitudinal portions along the nanowire, the second longitudinal portions having a substantially constant cross-section area smaller than the first longitudinal portion,
wherein the first longitudinal portion has a first dimension orthogonal to the core and a second dimension orthogonal to the first dimension and to the core, wherein an aspect ratio of the first dimension to the second dimension is at least about 1.5:1, and
wherein the core and the shell material have different compositions.

2. The article of claim 1, wherein the core comprises a semiconductor.

3. The article of claim 1, wherein the core comprises a metal.

4. The article of claim 1, wherein the core comprises a dielectric.

5. The article of claim 1, wherein the core comprises a semiconductor oxide.

6. The article of claim 1, wherein the core comprises $SiO_2$.

7. The article of claim 1, wherein the discontinuous first longitudinal portions comprising the shell materials have a periodicity of less than about 20 micrometers.

8. The article of claim 1, wherein the discontinuous first longitudinal portions comprising the shell materials are each separated by at least 5 nm.

9. The article of claim 1, wherein at least one of the shell materials consists of a single crystal.

10. The article of claim 1, wherein the shell comprises Si.

11. The article of claim 1, wherein the shell comprises a semiconductor.

12. The article of claim 1, wherein the shell comprises a metal.

13. The article of claim 1, wherein the shell comprises a dielectric.

* * * * *